(12) United States Patent
Zhang et al.

(10) Patent No.: US 11,244,947 B1
(45) Date of Patent: Feb. 8, 2022

(54) SEMICONDUCTOR DEVICE FOR A VOLATILE MEMORY AND METHOD OF MANUFACTURING SEMICONDUCTOR DEVICE

(71) Applicant: HeFeChip Corporation Limited, Hong Kong (HK)

(72) Inventors: John Zhang, Altamont, NY (US); Devendra K Sadana, Pleasantville, NY (US); Yanzun Li, Lagrangeville, NY (US); Huang Liu, Mechanicville, NY (US)

(73) Assignee: HeFeChip Corporation Limited, Sai Ying Pun (HK)

( * ) Notice: Subject to any disclaimer, the term of this patent is extended or adjusted under 35 U.S.C. 154(b) by 0 days.

(21) Appl. No.: 17/081,004

(22) Filed: Oct. 27, 2020

(51) Int. Cl.
*H01L 27/108* (2006.01)
*H01L 29/66* (2006.01)
*H01L 29/16* (2006.01)
*H01L 29/06* (2006.01)
*H01L 29/04* (2006.01)

(52) U.S. Cl.
CPC .... *H01L 27/10832* (2013.01); *H01L 27/1087* (2013.01); *H01L 27/10826* (2013.01); *H01L 27/10867* (2013.01); *H01L 27/10879* (2013.01); *H01L 27/10897* (2013.01); *H01L 29/045* (2013.01); *H01L 29/0673* (2013.01); *H01L 29/1608* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 9,437,675 B1 | 9/2016 | Cheng et al. | |
| 10,388,729 B2 | 8/2019 | Zhang et al. | |
| 2015/0279925 A1* | 10/2015 | Breil | H01L 27/10867 257/534 |

* cited by examiner

*Primary Examiner* — Anthony Ho
*Assistant Examiner* — Kevin Quinto
(74) *Attorney, Agent, or Firm* — Allen, Dyer, Doppelt + Gilchrist, PA

(57) ABSTRACT

A semiconductor device for a volatile memory is disclosed. The semiconductor device includes a substrate, a side wall and an epitaxial liner. The substrate has a first height and is made of a first material having a first lattice parameter. The side wall defines a deep trench. The epitaxial liner is disposed around the side wall, is made of a second material having a second lattice parameter, and has a second height having a same level with the first height, wherein the epitaxial liner and the side wall cooperate for creating a desired aspect ratio for the deep trench.

22 Claims, 48 Drawing Sheets

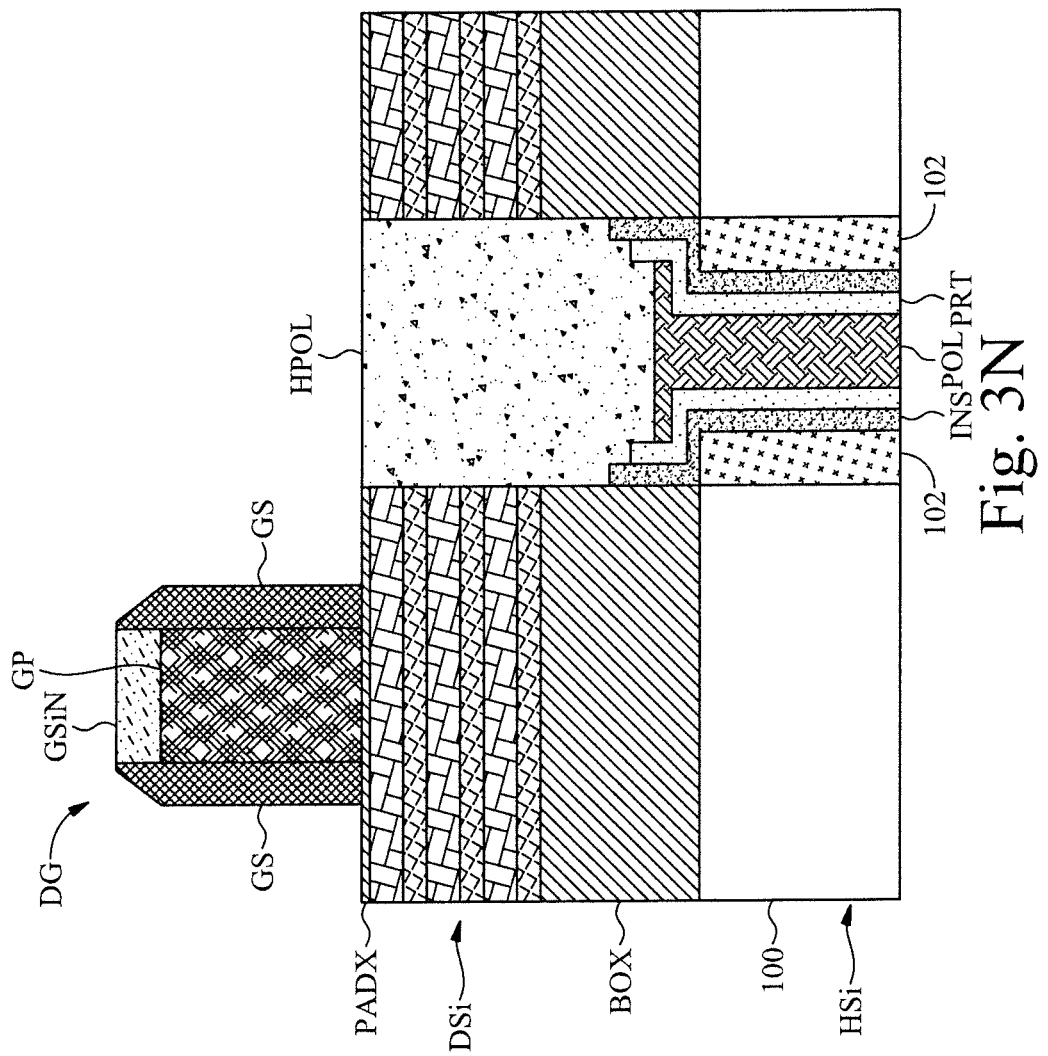

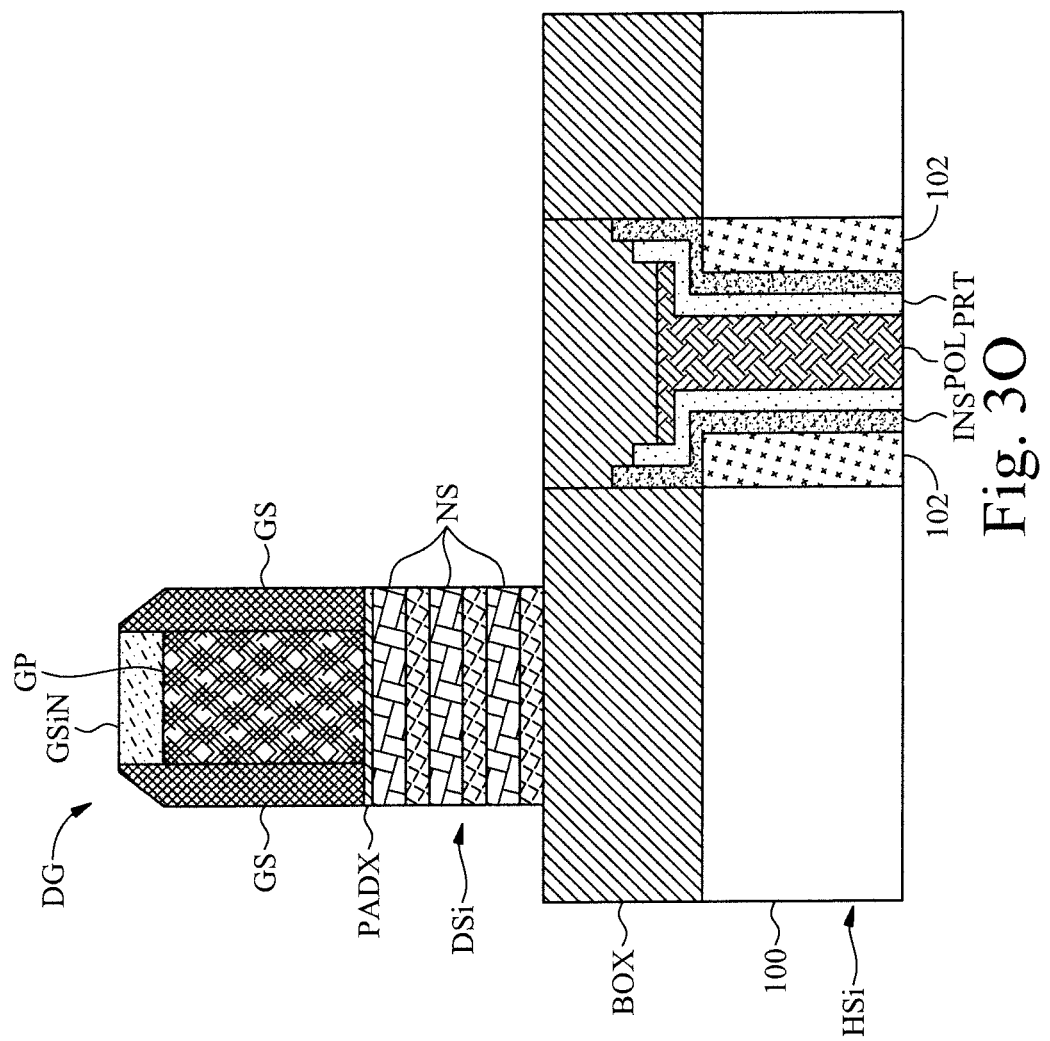

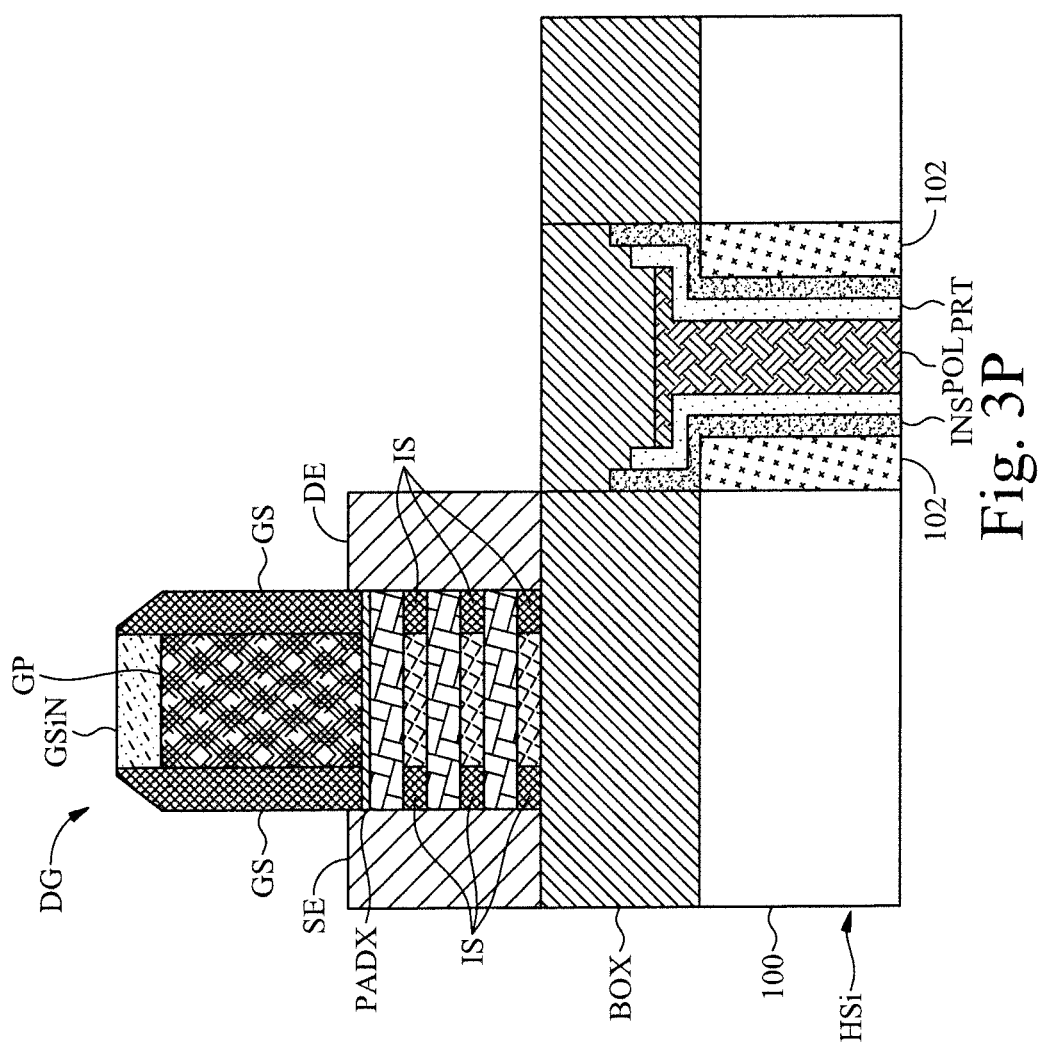

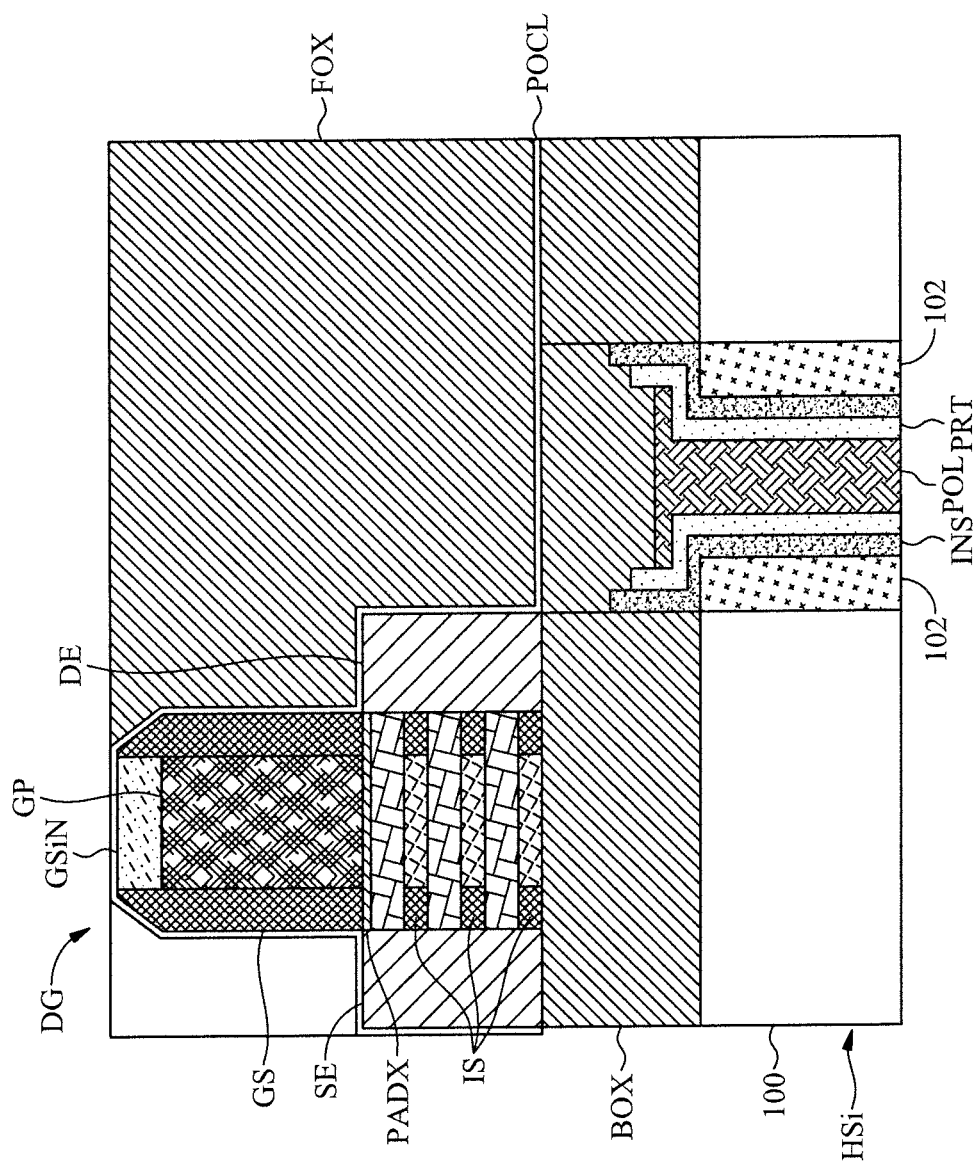

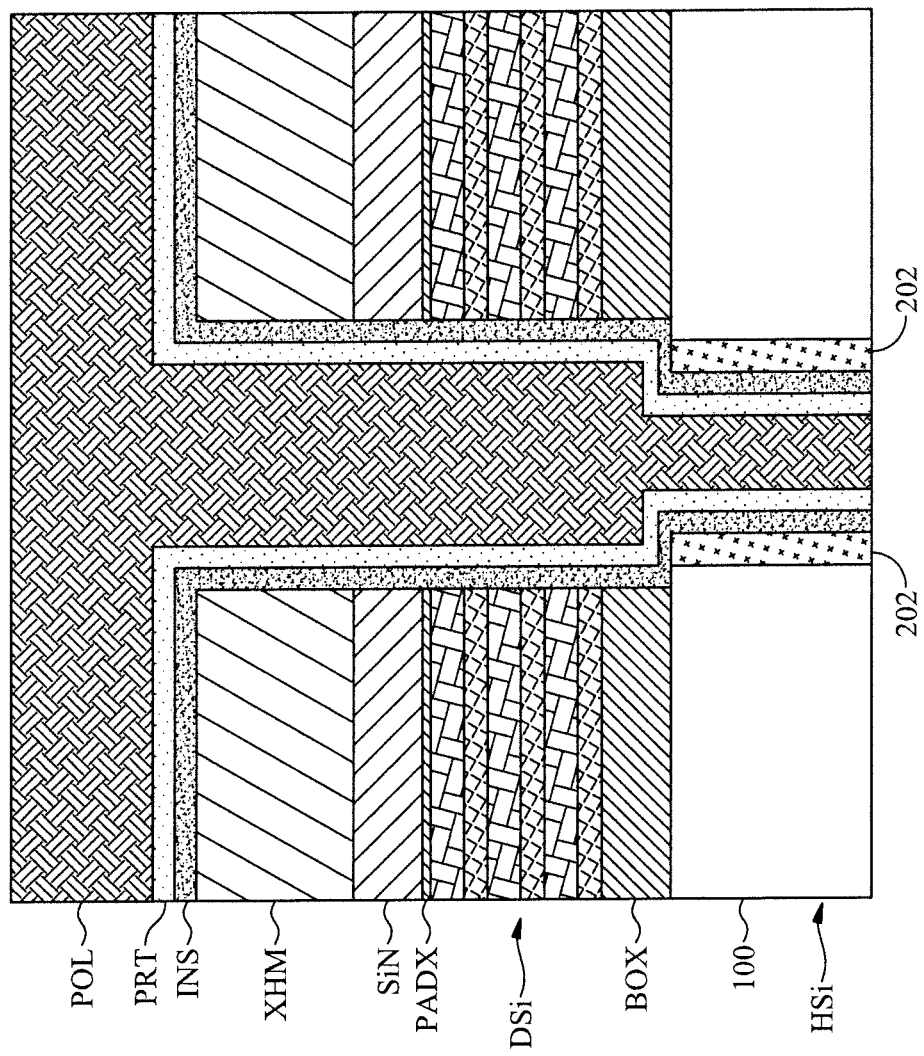

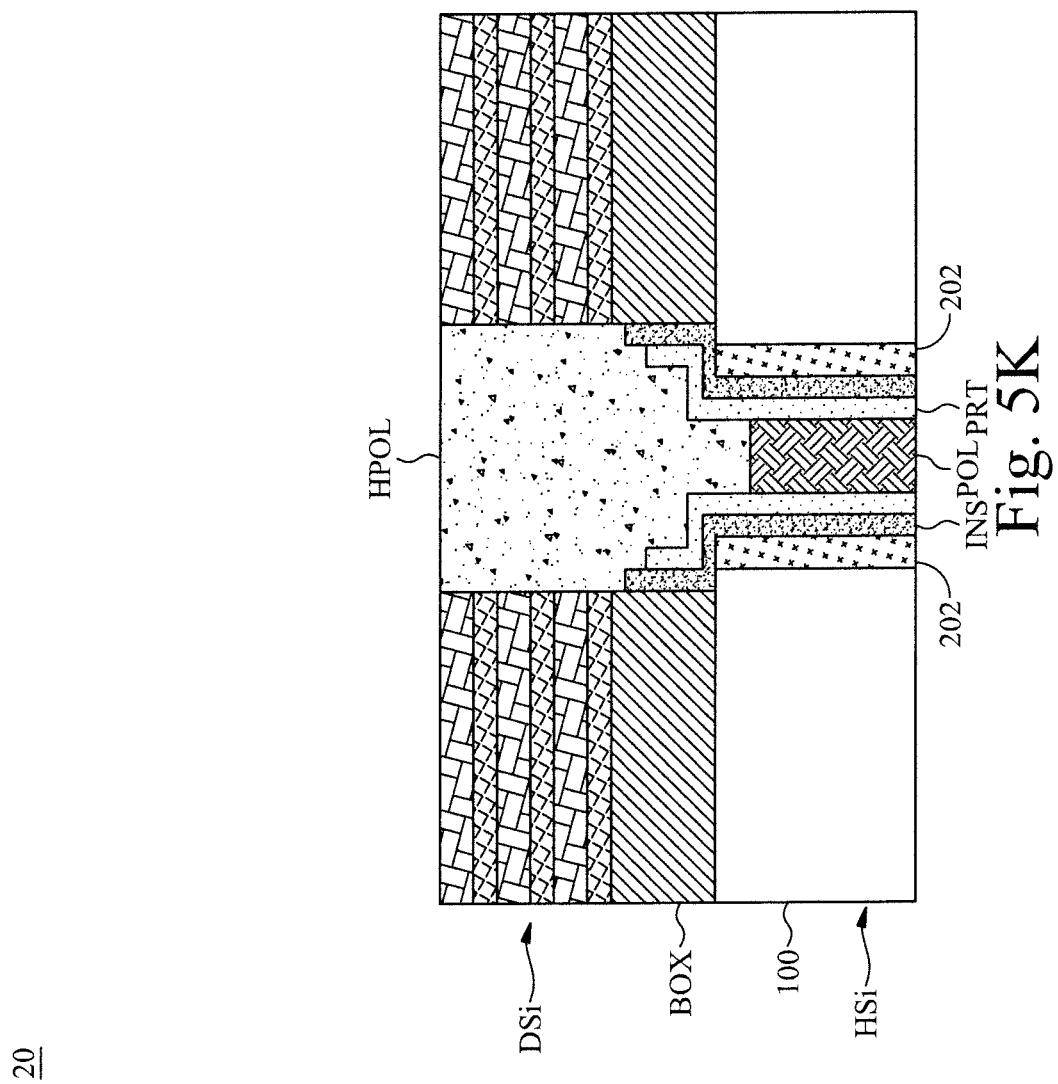

SEMICONDUCTOR DEVICE FOR A VOLATILE MEMORY AND METHOD OF MANUFACTURING SEMICONDUCTOR DEVICE

TECHNICAL FIELD

Embodiments of the present disclosure are related to a semiconductor device and a method of manufacturing a semiconductor device, and more particularly, are related to a semiconductor device for a volatile memory and a method of manufacturing a semiconductor device.

BACKGROUND

Deep trench capacitors (DTCs) are vertical semiconductor devices that are used to add capacitance to various integrated circuits. An advantage of using DTCs over package decapsulations is that they can be freely placed or embedded as close as possible to the desired circuit. In addition, DTCs can also provide higher capacitance per unit area.

DTCs form the main storage capacitor for one of the main families of DRAM-based cells called 'Embedded DRAM' which is fabricated on a standard CMOS process, allowing the mixture of a memory and a logic circuit on the same integrated circuit. DTCs are unique in many ways from other capacitors. First, they are formed by etching deep trenches (DTs) into the substrate. This enables very high capacitance density, especially when they are coupled in parallel. Secondly, because they tend to be very thin and deep, when combined with the logic circuit above, they may be used to form very dense structures such as an embedded DRAM, phase lock loop filters, decoupling circuitry, and other power applications.

The logic circuit is often electrically combined with a memory to form a memory cell, so that the logic circuit can be controlled to store, write or delete data in the memory. The logic circuit may be a transistor and is arranged near by the memory.

However, when the semiconductor process steps into the era of the very low number nanometer, a tensile stress in the deep trench of silicon on insulator (SOI) will cause local pattern sheet and global wafer warpage.

In other aspects, when a deep trench capacitor is designed to be combined with a low number nanometer scale transistor, such as a fin FET (field effect transistor), it is very challenging to combine a current fin FET with the deep trench capacitor to boost performance when the SOI semiconductor process is scaled from 14 nm to 10 nm.

In addition, when the deep trench capacitor is designed to be combined with a transistor manufactured below a dozen nm scale, such as a fin FET (field effect transistor), it is important that a good electrical conductivity therebetween should satisfy the requirements of a design specification and achieve an optimal performance.

In U.S. Pat. No. 10,388,729 B2, it only discloses how to make a nanosheet transistor with a uniform spacer, but the deep trench was not mentioned in this prior art. In U.S. Pat. No. 9,437,675, it discloses an eDRAM for planar III-V semiconductor devices; however, there are issues, such as leakage, difficult to fill in and stress control concern, no fin FET small size level, and the transistor size cannot be reduced.

Therefore, it is expected to have a structure or a material to tune the stress of the deep trench of silicon on insulator, also provide a mechanism to electrically combine the fin FET with the deep trench capacitor, and boost performance of the memory cell simultaneously.

SUMMARY OF INVENTION

In view of the drawbacks in the above-mentioned prior art, the present invention proposes a semiconductor device for a volatile memory and a method of manufacturing the semiconductor device.

In accordance with one embodiment of the present disclosure, a semiconductor device for a volatile memory is provided. The semiconductor device for a volatile memory includes a substrate, a side wall and an epitaxial liner. The substrate has a first height and is made of a first material having a first lattice parameter. The side wall defines a deep trench and has a first stress. The epitaxial liner is made of a second material having a second lattice parameter, is disposed around the side wall, has a second stress to offset the first stress, and has a second height having a level the same as that of the first height, wherein the first and the second lattice parameters are associated with the first stress of the side wall.

In accordance with another embodiment of the present disclosure, a method of manufacturing a semiconductor device for a volatile memory is provided. The method of manufacturing a semiconductor device for a volatile memory includes steps of: providing a substrate having a first height and made of a first material having a first lattice parameter; etching into the substrate to form a deep trench having a side wall having a first stress; depositing an epitaxial liner around the side wall, wherein: the epitaxial liner has a second height having a same level with the first height; the epitaxial liner is made of a second material having a second lattice parameter, and has a second stress to offset the first stress; and the first and the second lattice parameters are associated with the first stress of the side wall.

In accordance with a further embodiment of the present disclosure, a semiconductor device for a volatile memory is provided. The semiconductor device includes a substrate, a side wall and an epitaxial liner. The substrate has a first height and is made of a first material having a first lattice parameter. The side wall defines a deep trench. The epitaxial liner is disposed around the side wall, is made of a second material having a second lattice parameter, and has a second height having a same level with the first height, wherein the epitaxial liner and the side wall cooperate for creating a desired aspect ratio for the deep trench.

The above embodiments and advantages of the present invention will become more readily apparent to those ordinarily skilled in the art after reviewing the following detailed descriptions and accompanying drawings:

BRIEF DESCRIPTION OF THE DRAWINGS

FIGS. 3N-3V are schematic diagrams showing details of a sub method of forming a gate-all-around transistor and a conductor according to a preferred embodiment of the present disclosure;

FIGS. 5A-5K are schematic diagrams showing another detail of the method of manufacturing a semiconductor device for a volatile memory according to a preferred embodiment of the present disclosure;

DETAILED DESCRIPTION OF THE PREFERRED EMBODIMENTS

Please refer to all Figs. of the present invention when reading the following detailed description, wherein all Figs. of the present invention demonstrate different embodiments of the present invention by showing examples, and help the skilled person in the art to understand how to implement the present invention. The present examples provide sufficient embodiments to demonstrate the spirit of the present invention, each embodiment does not conflict with the others, and new embodiments can be implemented through an arbitrary combination thereof, i.e., the present invention is not restricted to the embodiments disclosed in the present specification.

Figure 1A:
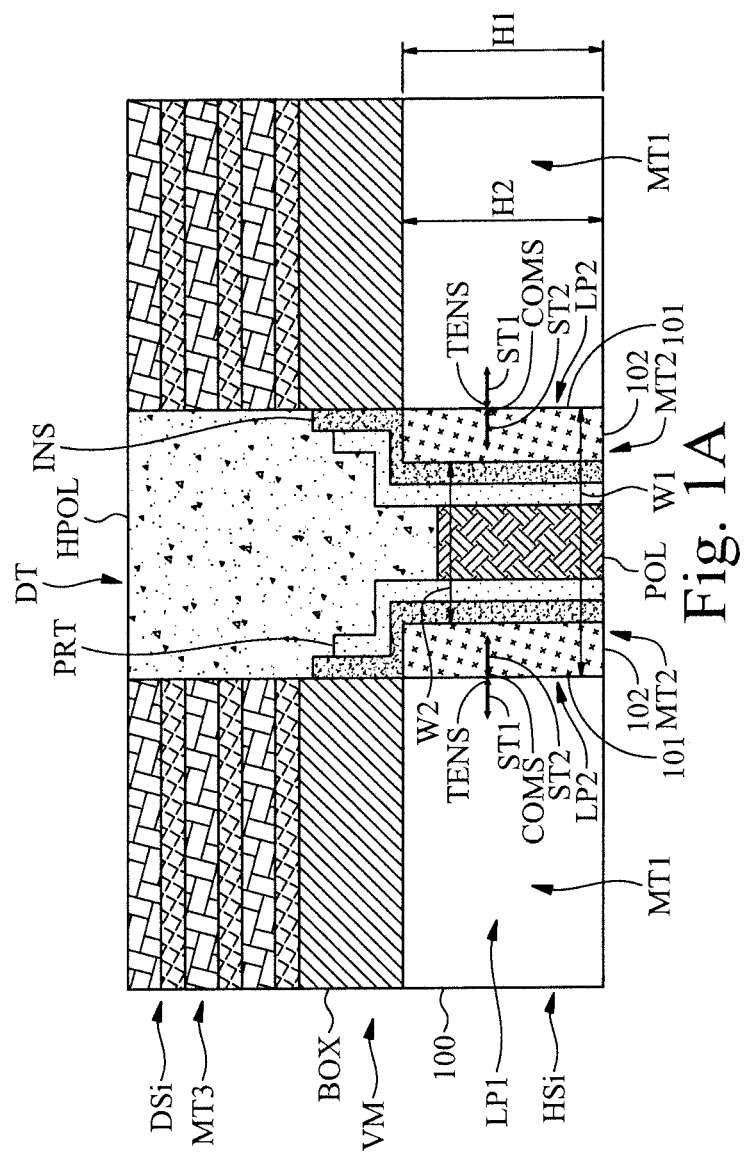
FIG. 1A is a schematic diagram showing a semiconductor device for a volatile memory according to a preferred embodiment of the present disclosure.

Please refer to FIG. 1A, which is a schematic diagram showing a semiconductor device 10 for a volatile memory VM according to a preferred embodiment of the present disclosure. The semiconductor device 10 includes a substrate 100, a side wall 101 and an epitaxial liner 102. The substrate 100 has a first height H1, and is made of a first material MT1 having a first lattice parameter LP1. The side wall 101 defines a deep trench DT, and has a first stress ST1. The epitaxial liner 102 is made of a second material MT2 having a second lattice parameter LP2, is disposed around the side wall 101, has a second stress ST2 to offset the first stress ST1, and has a second height H2 having a level the same as that of the first height H1, wherein the first and the second lattice parameters LP1 and LP2 are associated with the first stress ST1 of the side wall 101.

In FIG. 1A, a depth of the deep trench DT below a burry oxide BOX ranges from 1000 nm to 6000 nm, and a diameter of the deep trench DT ranges from 20 nm to 100 nm. A thickness of the burry oxide BOX ranges from 3-200 nm. An aspect ratio W1/W2 scaling of the deep trench DT is highly challenging beyond a specific nanometer technology node (for example, 14 nm), and a tensile stress TENS in the specific nanometer SOI deep trench DT may cause local pattern shift and global wafer warp. By a selective epitaxial liner 102 of undoped or dope Si contacting compounds (for example, SiGe, P or As doped Si, C-doped Si etc.) in the same opening as that used in 14 nm technology, it will allow aspect ratio W1/W2 tuning due to the reduced size of the opening in the deep trench DT by an epitaxial growth. For example, by performing a selective epitaxial growth of a pseudomorphic SiGe liner on the side wall 101 in the deep trench DT, it will create compressive stress COMS to a level that can offset the existing tensile strain TENS. The volatile memory VM further includes an insulation structure 103, a protection layer PRT, a poly silicon POL and a heavily doped pole are deposited sequentially. The epitaxial liner 102, an insulation structure 103, a protection layer PRT and a poly silicon POL form a capacitor CDT, for example a deep trench capacitor.

In any one of the embodiments of the present disclosure, the deep trench DT has an aspect ratio tuned by the epitaxial liner. The side wall 101 is formed by a crystalline material. Under a condition that the second lattice parameter LP2 is larger than the first lattice parameter LP1, a compressive strain COMS is created by disposing the epitaxial liner 102 around the side wall 101. Under a condition that the second lattice parameter LP2 is smaller than the first lattice parameter LP1, a tensile strain TENS is created by disposing the epitaxial liner 102 around the side wall 101.

In any one of the embodiments of the present disclosure, the second material MT2 includes a IV compound having a first IV element and a second IV element, and the first IV and the second IV elements are in x and y proportions in the IV compound respectively. The first IV element is silicon, the second IV element is germanium, and the silicon and the germanium form a $Si_xGe_y$ compound. The epitaxial liner 102 is substantially pseudomorphic to provide a design strain type COMS and a design strain magnitude according to the x and the y proportions.

For example, in order to compensate a 0.5% of the tensile strain TENS in the deep trench DT, a pseudormorphic layer of the $Si_{0.9}Ge_{0.1}$ compound will be sufficient to neutralize the tensile strain TENS.

In any one of the embodiments of the present disclosure, the x proportion ranges from 0.1 to 0.6. The process forming the epitaxial liner 102 is readily available and can be implemented in manufacturing environment on existing tools when needed.

In any one of the embodiments of the present disclosure, the side wall 102 in the deep trench DP is formed by a crystalline material having a crystallographic orientation (110).

In any one of the embodiments of the present disclosure, the side wall 102 in the deep trench DP is formed by a crystalline material having a crystallographic orientation (100).

In any one of the embodiments of the present disclosure, the first material MT1 is a host material, and the host material MT1 is a bulk crystalline material having at least one epitaxial layer grown over its surface.

In any one of the embodiments of the present disclosure, the substrate 100 is a handle Si layer, and the semiconductor device 10 further includes a buried oxide layer BOX and a device Si layer DSi. The buried oxide layer BOX is disposed above the handle Si layer HSi. The device Si layer DSi is disposed above the buried oxide layer BOX and is made of a third material MT3, wherein the first material MT1 has a crystallographic orientation substantially similar to that of the third material MT3. In some embodiments, the first material MT1 has a crystallographic orientation substantially different from that of the third material MT3.

Figure 1B:
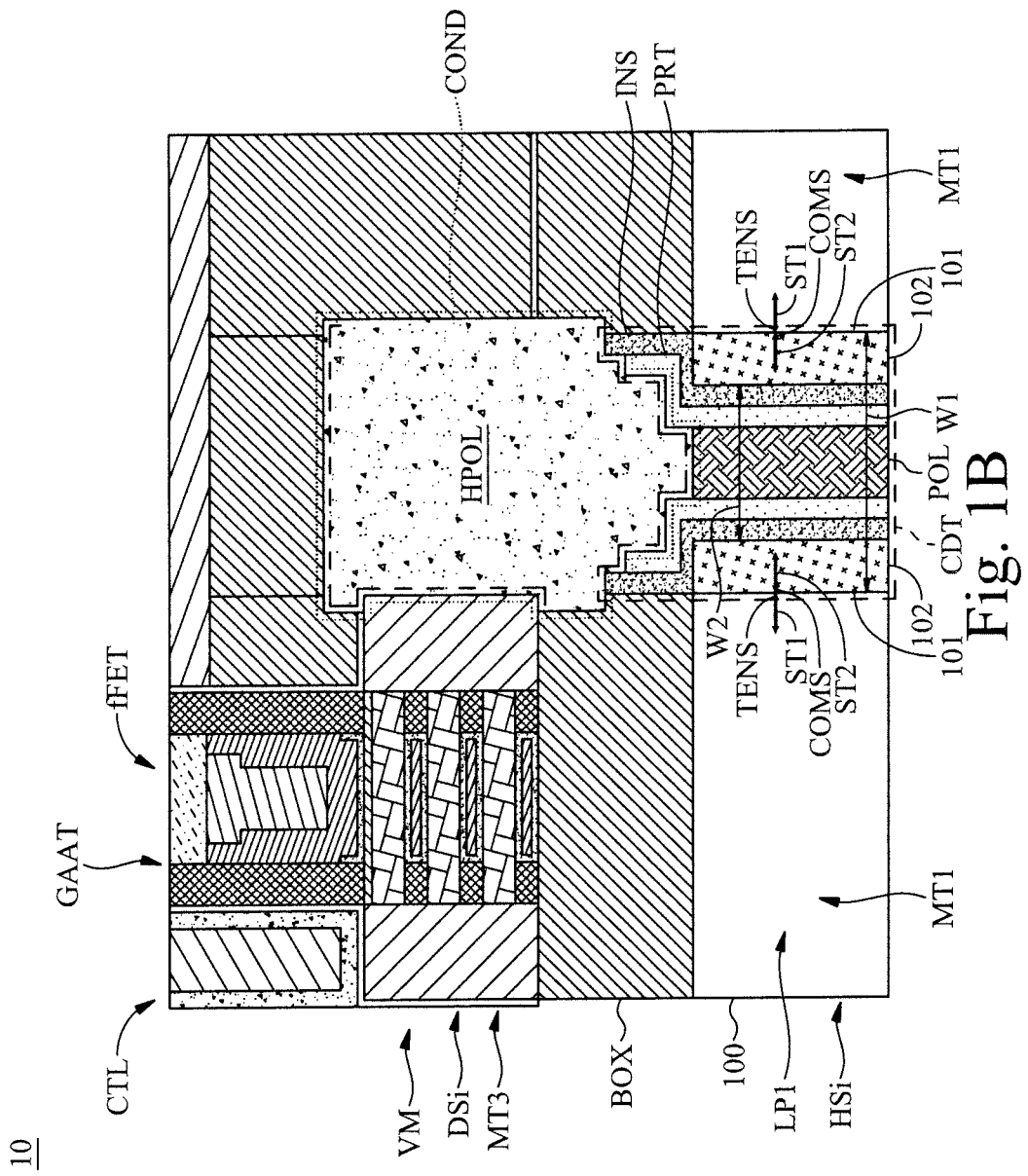
FIG. 1B is a schematic diagram showing the volatile memory having a control logic circuit and a conductor according to a preferred embodiment of the present disclosure.

Please refer to FIG. 1B, which is a schematic diagram showing the volatile memory VM having a control logic circuit CTL and a conductor COND according to a preferred embodiment of the present disclosure. The volatile memory VM can include the control logic circuit CTL. For example, a switch or a transistor, included in the control logic circuit CTL, is controlled for the volatile memory VM to store, write, delete or amend data. The volatile memory VM can be a dynamic RAM including the capacitor CDT, and further includes the conductor COND and a fin FET fFET. For example, the fin FET fFET is a gate-all-around transistor GAAT. The manufacturing of the capacitor CDT in the volatile memory VM will be described firstly, and then the process for connecting the capacitor CDT and a gate-all-around transistor GAAT via the conductor COND will be described later.

Figure 3A:
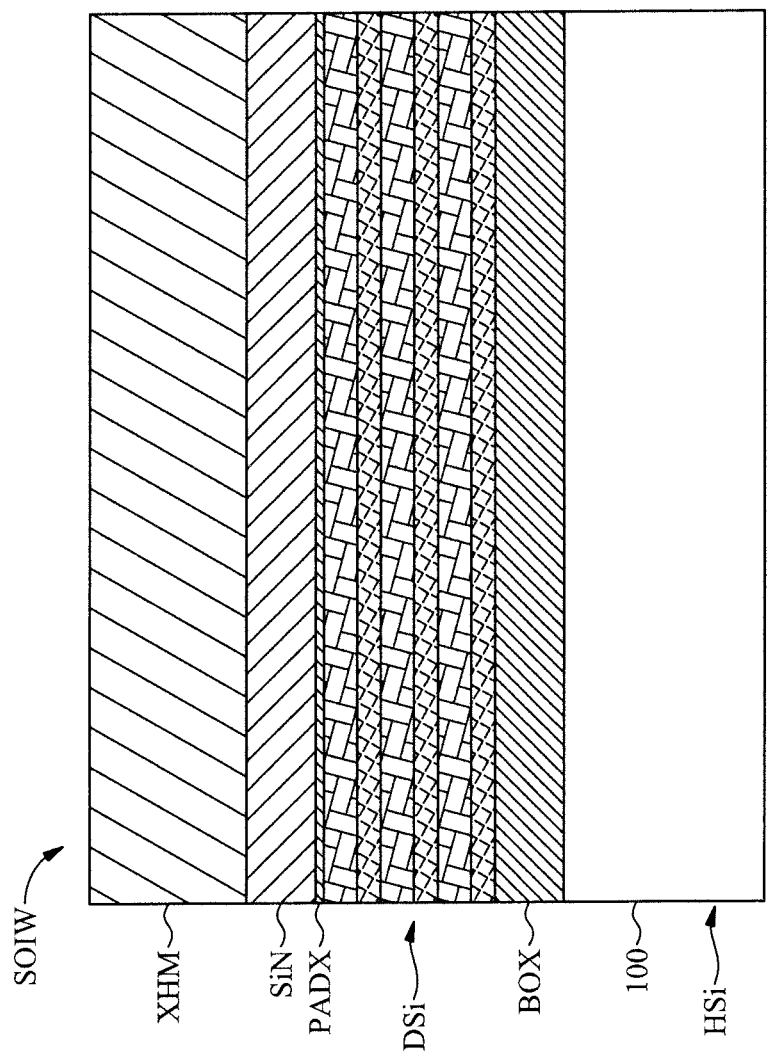
FIGS. 3A-3M are schematic diagrams showing details of the method of manufacturing a semiconductor device for a volatile memory according to a preferred embodiment of the present disclosure.

In any one of the embodiments of the present disclosure, the conductor COND is disposed in the deep trench DT. The conductor COND includes one of a heavily doped poly silicon HPOL or a metal MET (shown in FIG. 6H). The conductor COND may further include a metal liner METL. The gate-all-around transistor GAAT is electrically connected to the capacitor CDT through the conductor COND. The gate-all-around transistor GAAT is a fin FET fFET including one of a plurality of Silicon nanosheets or nanowires, a plurality of Silicon-Germanium nanosheets or nanowires, or a plurality of Silicon-Carbon nanosheets or nanowires NS (shown in FIG. 3O), and is adjacent to the conductor COND for being electrically connected to the capacitor CDT, wherein the plurality of Silicon-Germanium nanosheets or nanowires NS has a Germanium proportion<20%, and the plurality of Silicon-Carbon nanosheets or nanowires NS has a Carbon proportion<2%.

Figure 2:
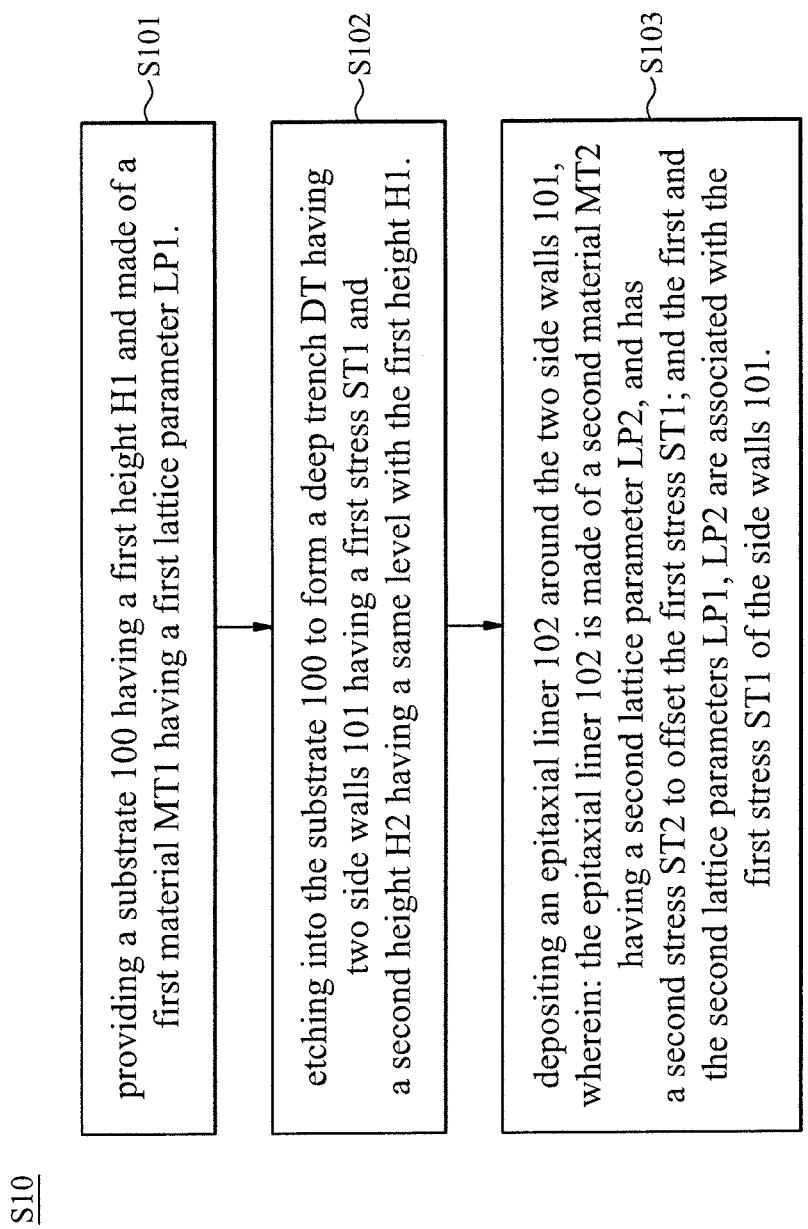
FIG. 2 is a schematic diagram showing a method of manufacturing a semiconductor device for a volatile memory according to a preferred embodiment of the present disclosure.

Please refer to FIG. 2, which is a schematic diagram showing a method S10 of manufacturing a semiconductor device 10 for a volatile memory VM according to a preferred embodiment of the present disclosure. The method S10 includes steps of: step S101, providing a substrate 100 having a first height H1 and made of a first material MT1 having a first lattice parameter LP1; step S102, etching into the substrate 100 to form a deep trench DT having a side wall 101 having a first stress ST1 and a second height H2 having a same level with the first height H1; step S103, depositing an epitaxial liner 102 around the side wall 101, wherein: the epitaxial liner 102 is made of a second material MT2 having a second lattice parameter LP2, and has a second stress ST2 to offset the first stress ST1; and the first and the second lattice parameters LP1 and LP2 are associated with the first stress ST1 of the side walls 101.

Please refer to FIGS. 3A-3M, which are schematic diagrams showing details of the method S10 of manufacturing a semiconductor device 10 for a volatile memory VM according to a preferred embodiment of the present disclosure. The substrate 100 is a handle Si layer HSi; a buried oxide layer BOX is formed above the handle Si layer HSi; and a device Si layer DSi is formed above the buried oxide layer BOX.

In any one of the embodiments of the present disclosure, the semiconductor device 10 starts with a silicon on insulator wafer SOIW. Please refer to FIG. 3A. The method S10 further includes the following steps of: depositing sequentially a pad oxide layer PADX, a SiN layer SiN and an oxide hard mask layer XHM on the device Si layer DSi. For illustrations, the thicknesses of the buried oxide layer BOX, the pad oxide layer PADX, the SiN layer SiN and the oxide hard mask layer XHM are 3-200 nm, 0.3-10 nm, 20-150 nm and 200-1000 nm respectively, and the thickness of the handle Si His is 1000-6000 nm. The device Si DSi may include multiple SiGe and Si interlaced with each other to form stack layers, each of which has a thickness 3-60 nm.

Figure 3B:
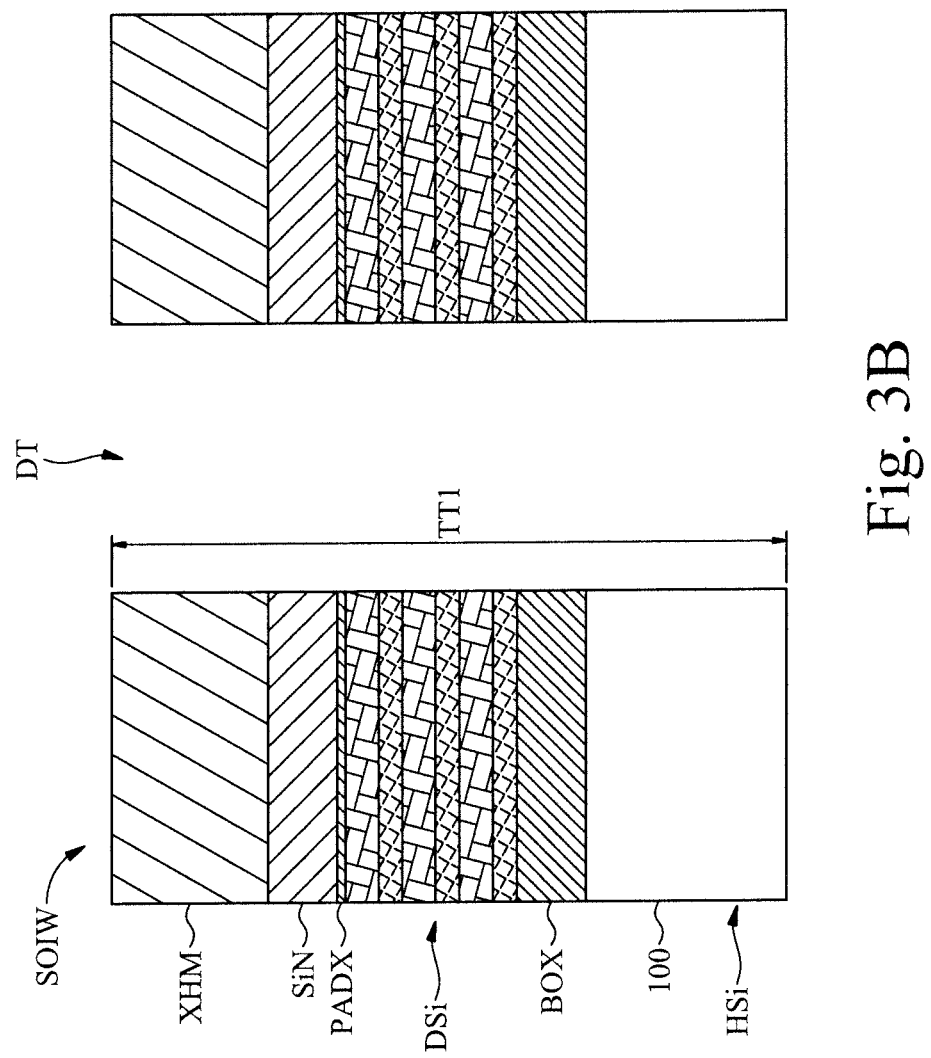

Please refer to FIG. 3B. In any one of the embodiments of the present disclosure, the method S10 further includes the following steps of: etching the handle Si layer HSi, the buried oxide layer BOX, the device Si layer DSi, the pad oxide PADX, the SiN layer SiN, and the oxide hard mask XHM to a first target thickness TT1 to form the deep trench DT by a Reactive-Ion Etching (RIE) process. For illustrations, the depth of the deep trench DT below the buried oxide layer BOX ranges from 1000 nm to 6000 nm, and the diameter of the deep trench DT ranges from 20 nm to 100 nm.

Figure 3C:
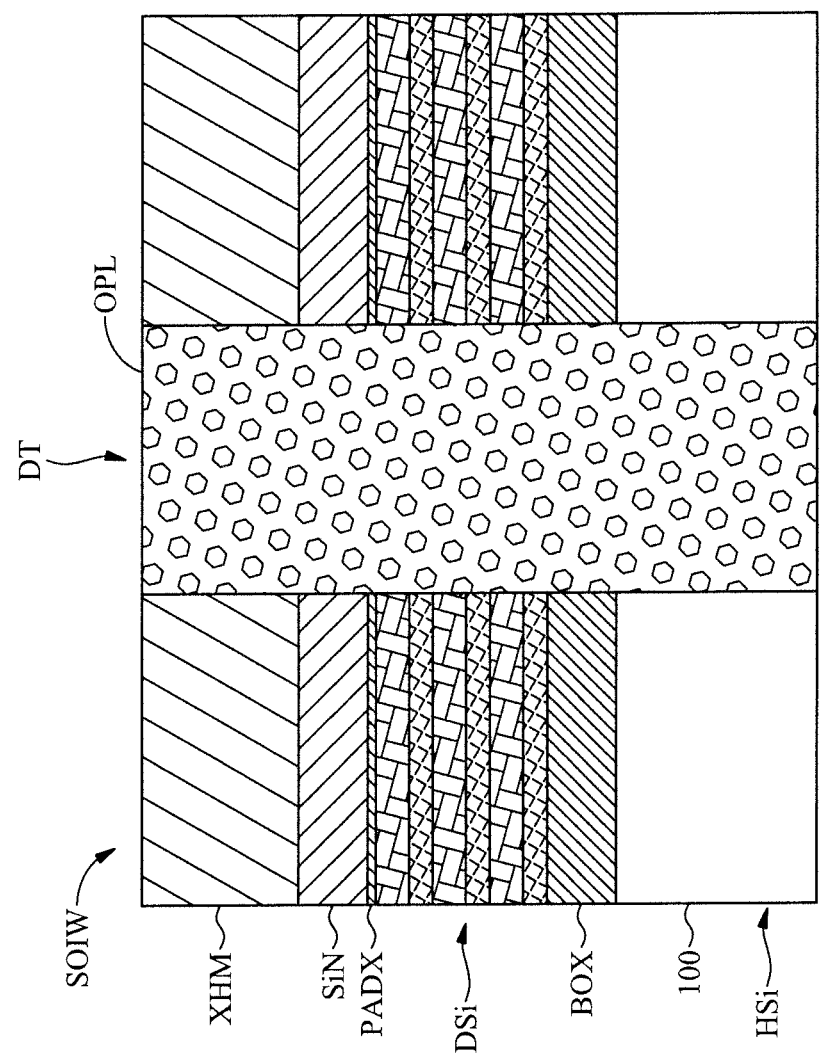

Please refer to FIG. 3C. In any one of the embodiments of the present disclosure, the method S10 further includes the step of: filling the deep trench DT with an organic planarization layer OPL.

Figure 3D:
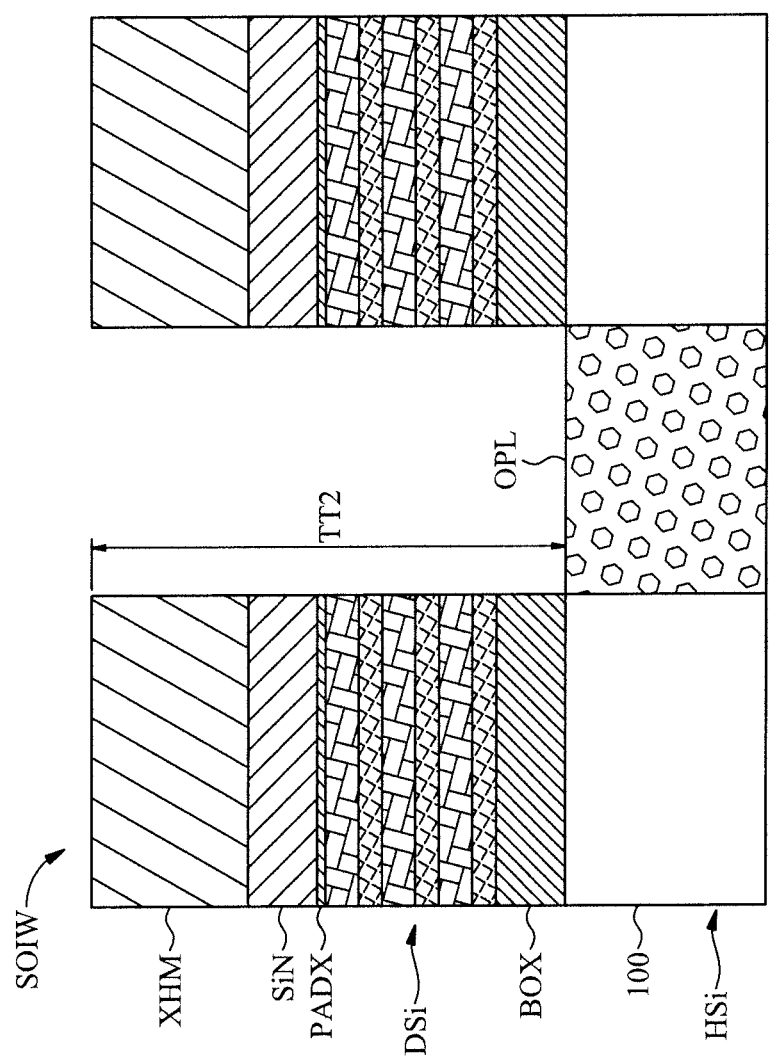

Please refer to FIG. 3D. In any one of the embodiments of the present disclosure, the method S10 includes the step of: recessing the organic planarization layer OPL to a second target thickness TT2.

Figure 3E:
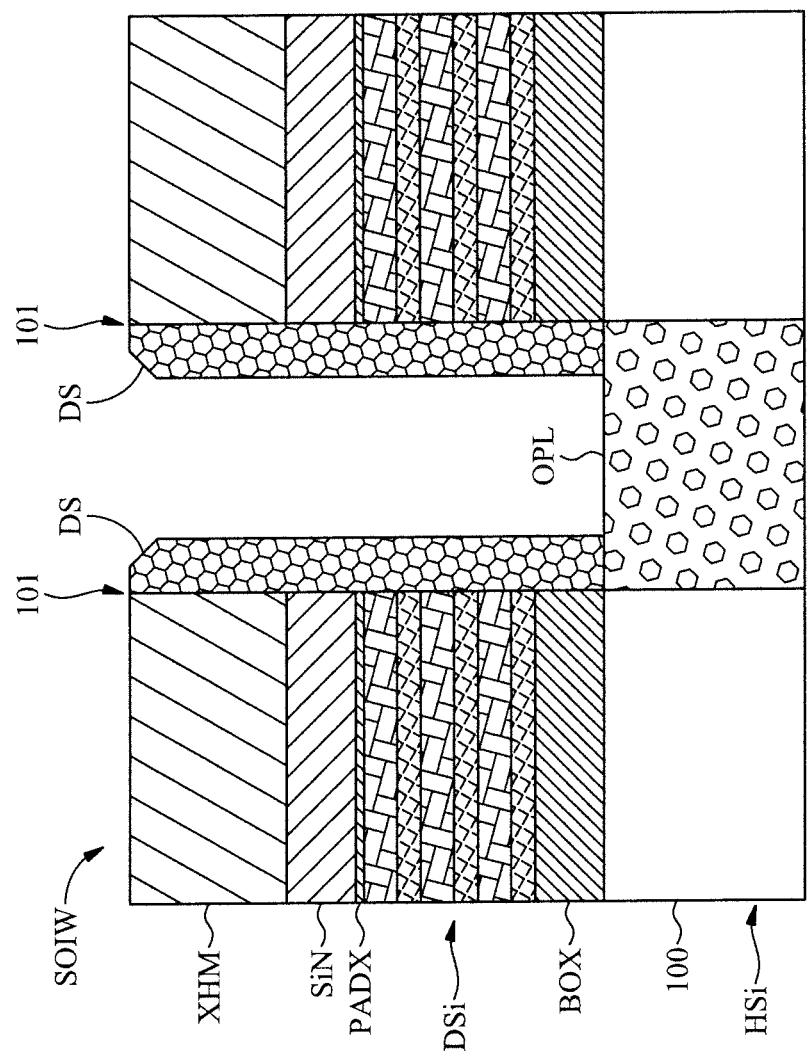

Please refer to FIG. 3E. In any one of the embodiments of the present disclosure, the method S10 includes the step of: forming a dielectric spacer DS above the organic planarization layer OPL and on the side wall 101.

Figure 3F:
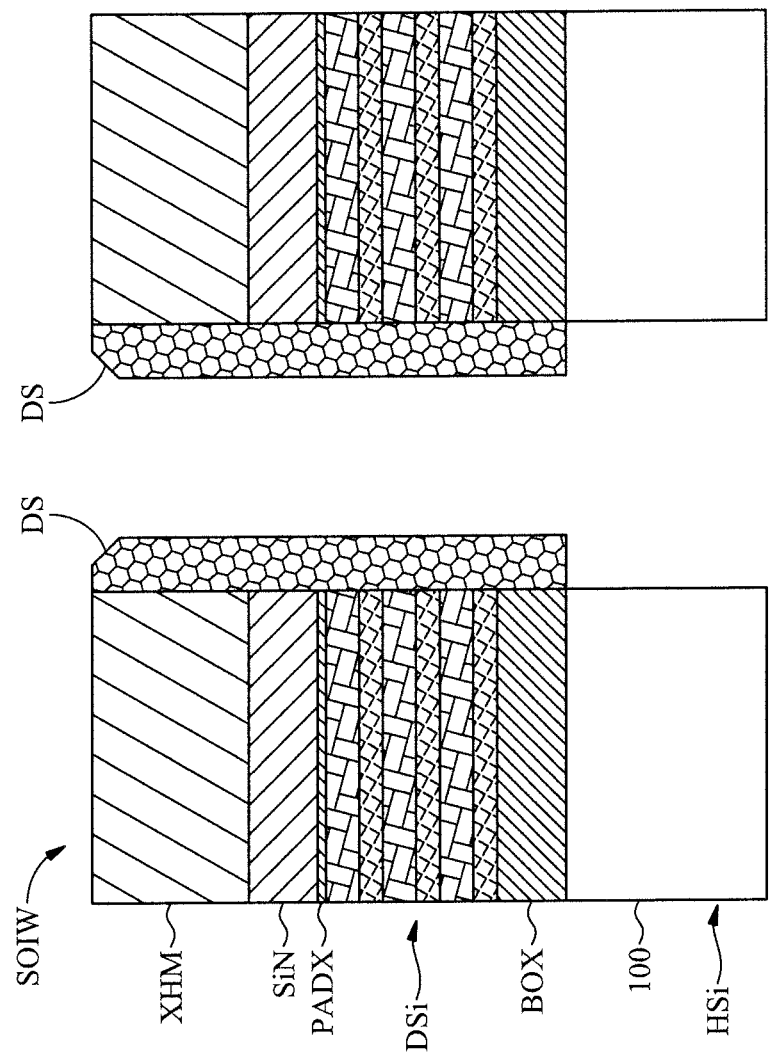

Please refer to FIG. 3F. In any one of the embodiments of the present disclosure, the method S10 includes the step of: stripping the recessed organic planarization layer OPL.

Figure 3G:
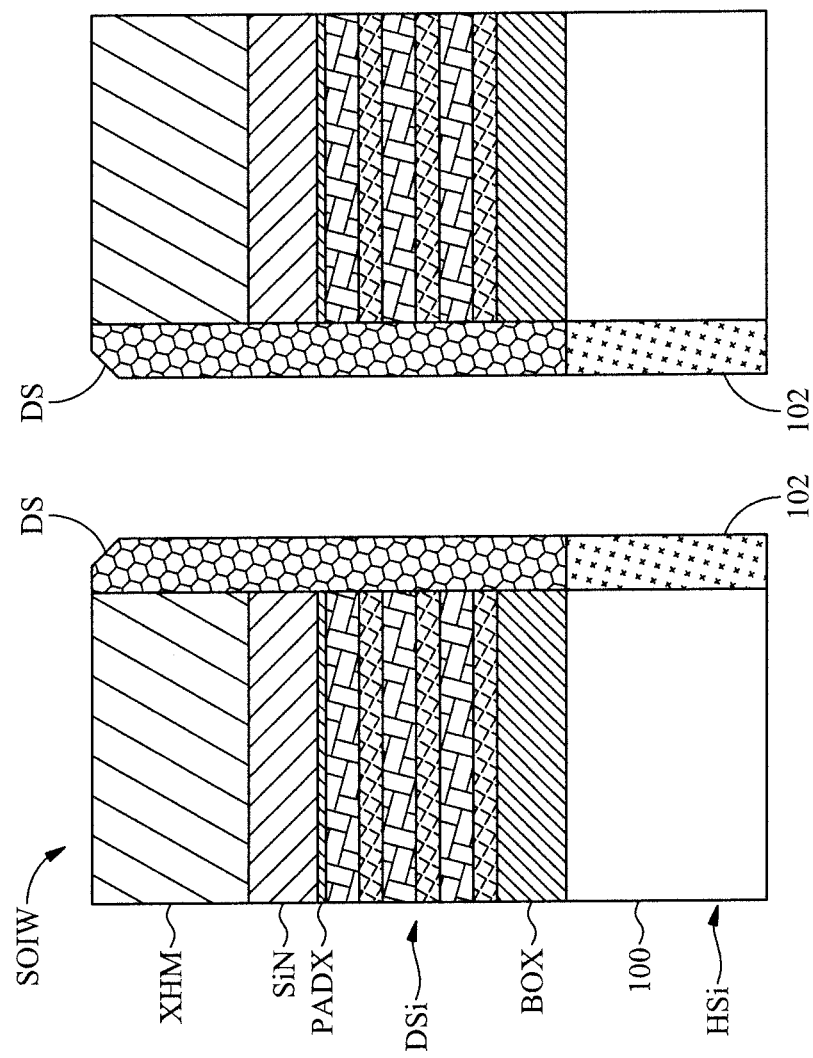

Please refer to FIG. 3G. In any one of the embodiments of the present disclosure, the method S10 includes the step of: disposing an epitaxial liner 102 below the dielectric spacer DS.

Figure 3H:
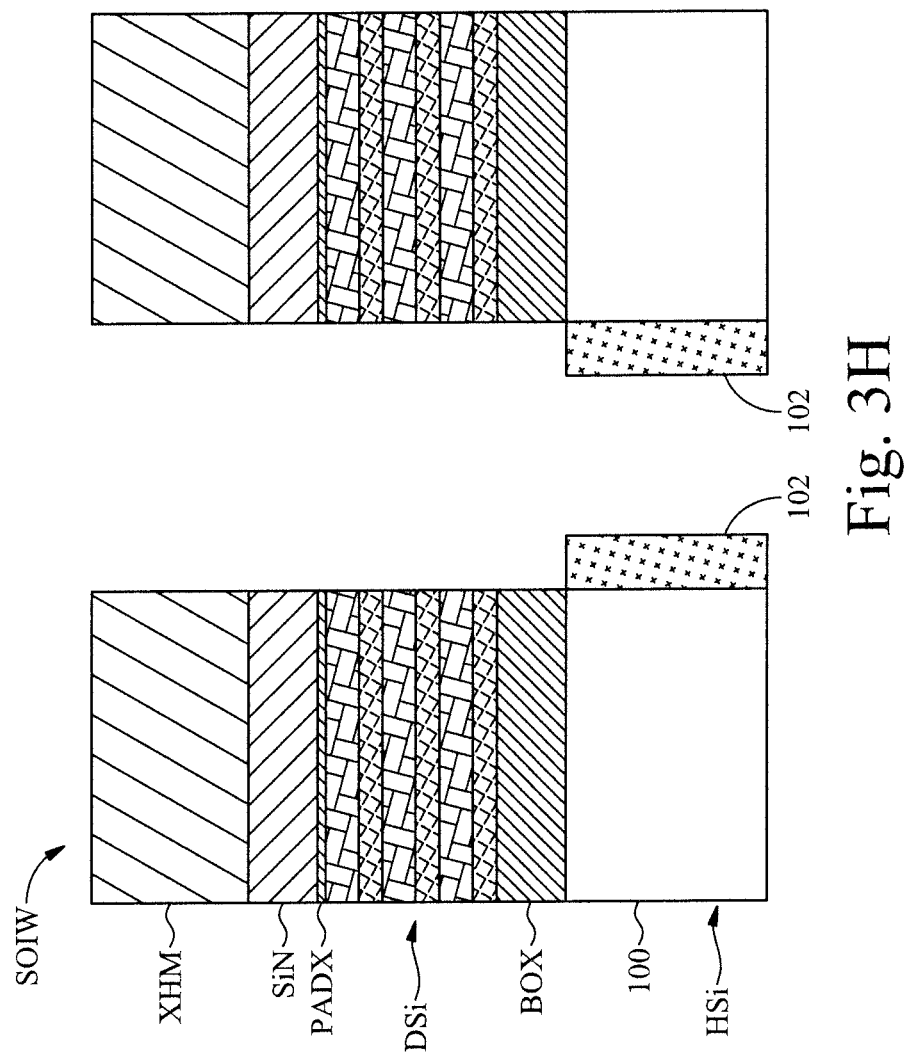

Please refer to FIG. 3H. In any one of the embodiments of the present disclosure, the method S10 includes the step of: stripping the dielectric spacer DS.

Figure 3I:
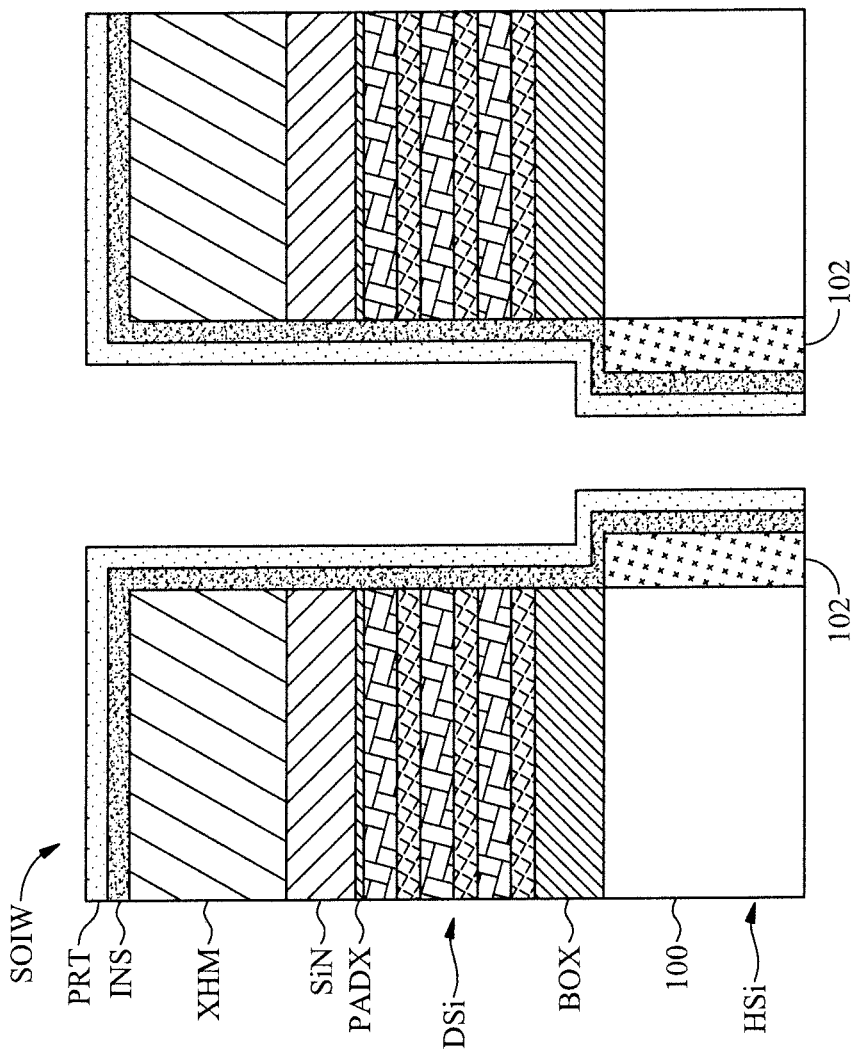

Please refer to FIG. 3I. In any one of the embodiments of the present disclosure, the method 10 includes the step of: depositing an insulation structure INS and a protecting layer PRT on the epitaxial liner 102 and the side wall 101, wherein the protecting layer PRT includes TiN, and for illustrations, each of the thickness of the insulation layer INS and the protection layer PRT is 3-12 nm. For illustrations, both of the thicknesses of the insulation layer INS and the protection layer PRT are 3-12 nm.

Figure 3J:
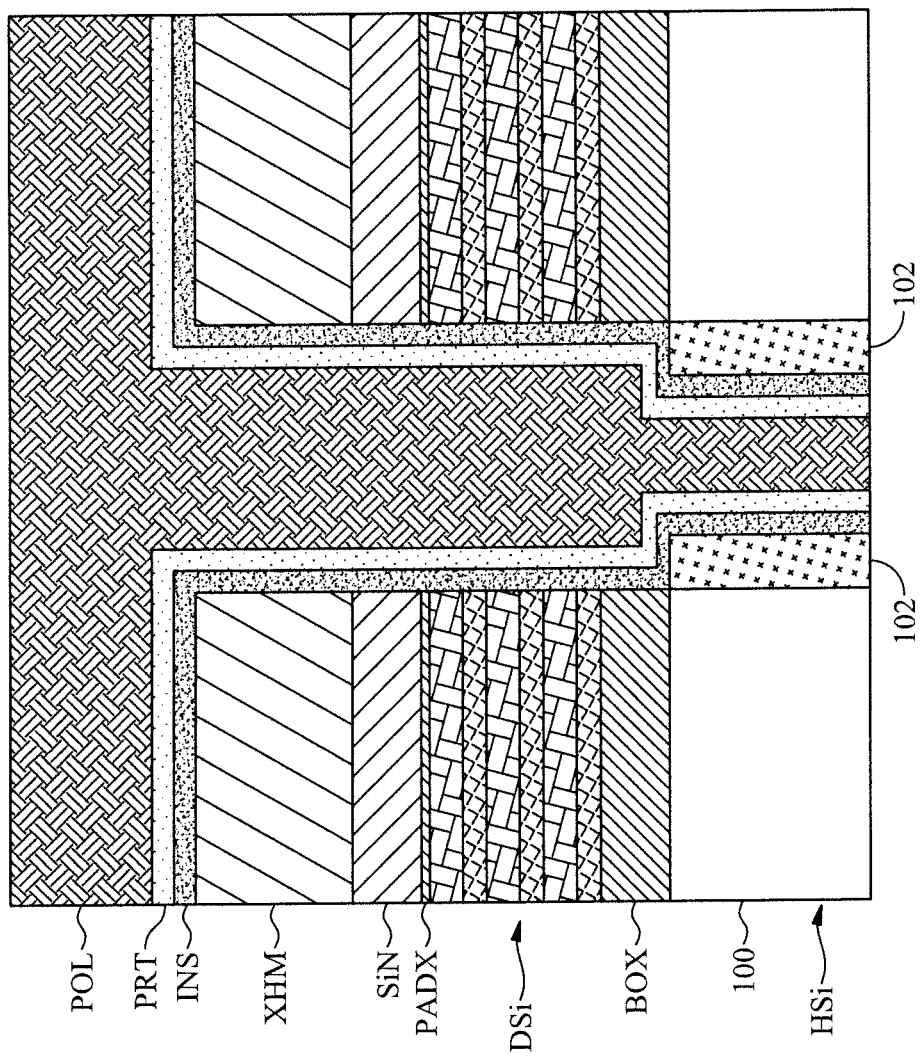

Please refer to FIG. 3J. In any one of the embodiments of the present disclosure, the method S10 includes the step of: depositing a poly silicon POL on the insulation structure INS and the protecting layer PRT; for illustrations, the thickness of the poly silicon POL above the protection layer PRT is 200-1000 nm.

Figure 3K:
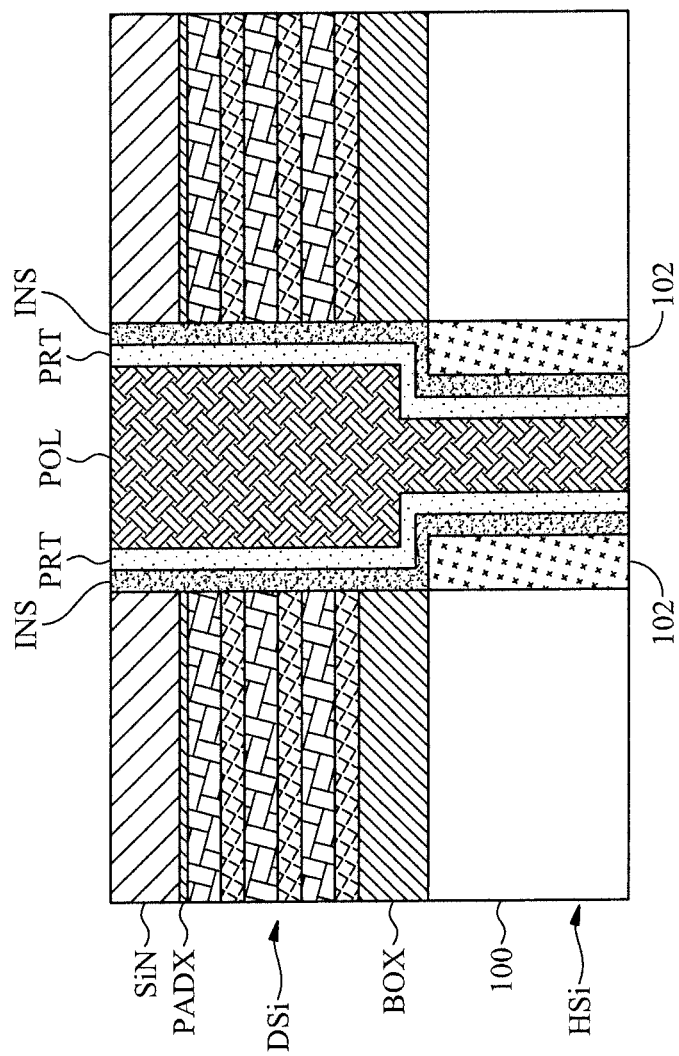

Please refer to FIG. 3K. In any one of the embodiments of the present disclosure, the method 10 includes the step of: performing a chemical mechanical polishing (CMP) process by starting from the poly silicon POL and stopping on the SiN layer SiN.

Figure 3L:
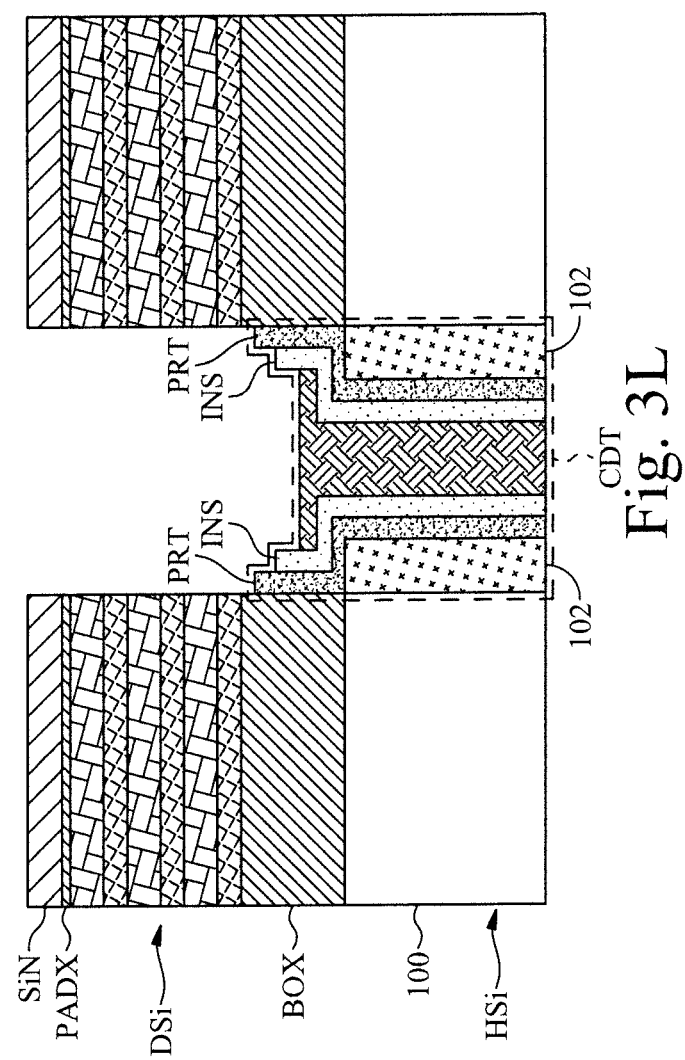

Please refer to FIG. 3L. In any one of the embodiments of the present disclosure, the method S10 includes the step of: recessing a part of the polished poly silicon POL, a part of the polished TiN and a part of the polished insulator structure INS.

Figure 3M:
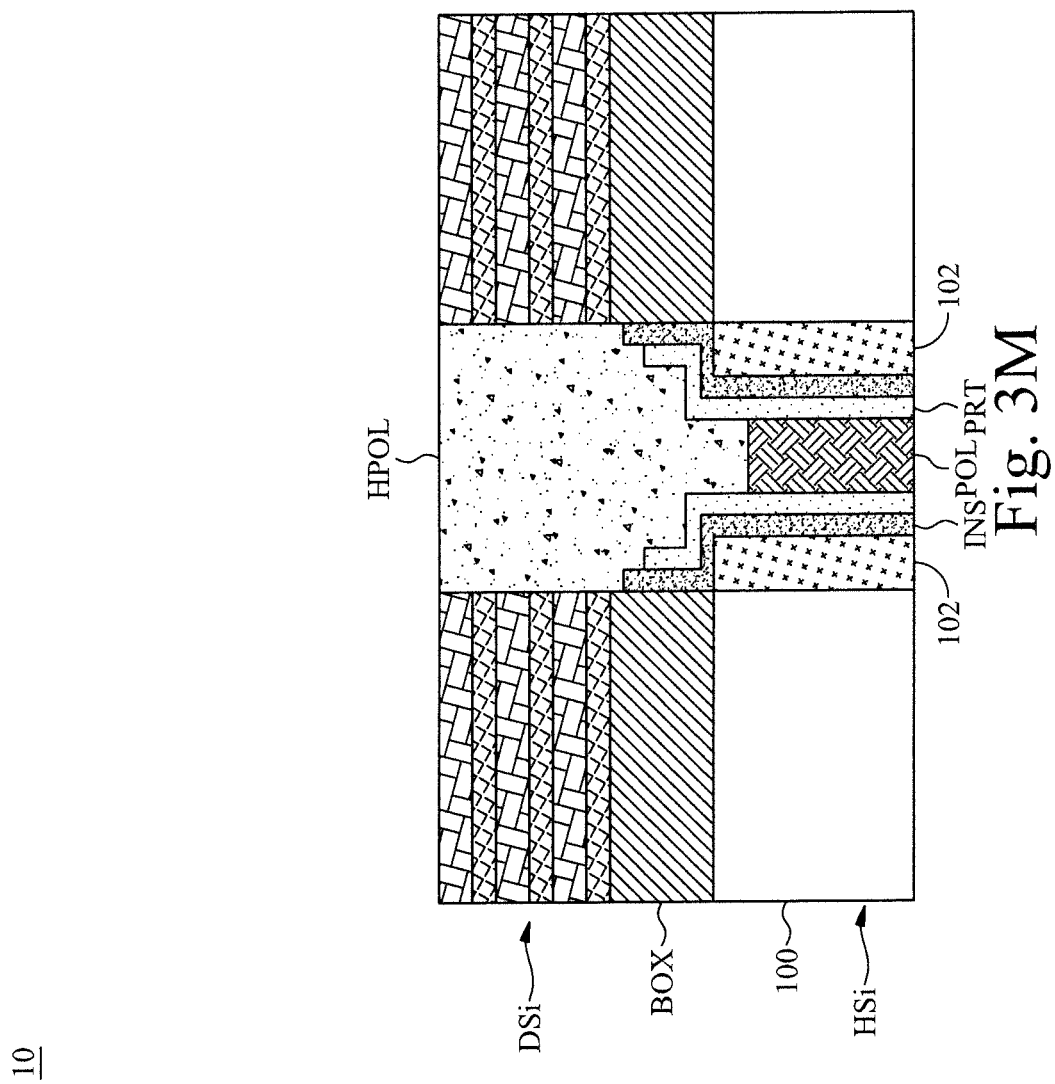

Please refer to FIG. 3M. In any one of the embodiments of the present disclosure, the method S10 includes the following steps of: filling with a high dope poly HPOL; and performing a CMP process by starting from the SiN layer and stopping on the device Si layer. In FIG. 3M, the semiconductor device 10 for the volatile memory VM, also shown in FIG. 1A, can be applied to both bulk, SOI having different crystal orientation, for example, SiGe or Si orientation.

In any one of the embodiments of the present disclosure, the process for connecting the capacitor CDT and a gate-all-around transistor GAAT via the conductor COND is described as follows. The method S10 further includes a sub method of forming a gate-all-around transistor GAAT and a conductor COND. The sub method follows by the step in FIG. 3M, and includes sub steps as shown in FIGS. 3N-3V.

Please refer to FIG. 3N. In any one of the embodiments of the present disclosure, the method S10 includes the step of: forming a gate poly GP, a gate SiN layer GSiN on the gate poly GP and a gate spacer GS respectively to form a dummy gate DG on the device Si layer DSi by respectively performing a combination process of a depositing process and the RIE process. For illustrations, the width of each gate spacer GS is 3-30 nm, the height of the gate poly GP is 30-150 nm, and the thickness of the gate SiN layer GSiN is 20-50 nm.

Please refer to FIG. 3O. In any one of the embodiments of the present disclosure, the method S10 includes the step of: forming uniform nano sheets NS aligned to the dummy gate DG by the RIE process.

Please refer to FIG. 3P. In any one of the embodiments of the present disclosure, the method S10 includes the following steps of: forming inner spacers IS; and performing an epitaxy on the uniform nano sheets NS to form a source electrode SE and a drain electrode DE, and thus a gate-all-around transistor GAAT is formed.

Please refer to FIG. 3Q. In any one of the embodiments of the present disclosure, the method S10 includes the following steps of: depositing a poly-open CMP (POC) liner POCL, which includes a SiN liner formed on the gate SiN layer GSiN, a field oxide FOX; and performing the CMP process to stop on the POC liner POCL.

Figure 3R:
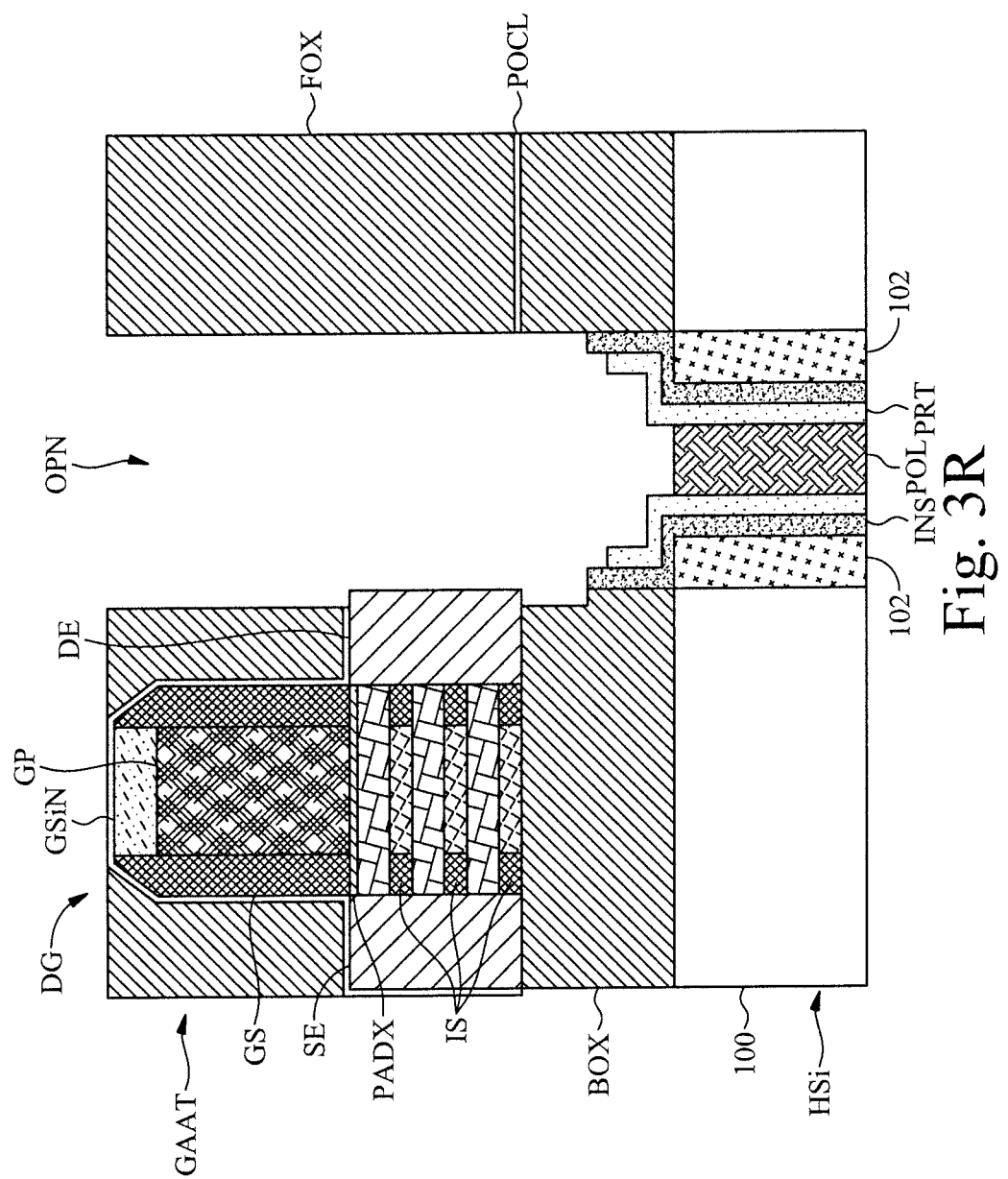

Please refer to FIG. 3R. In any one of the embodiments of the present disclosure, the method S10 includes the step of: performing the RIE process to form a first opening OPN1 for connecting the gate-all-around transistor GATT and the poly silicon POL.

Figure 3S:
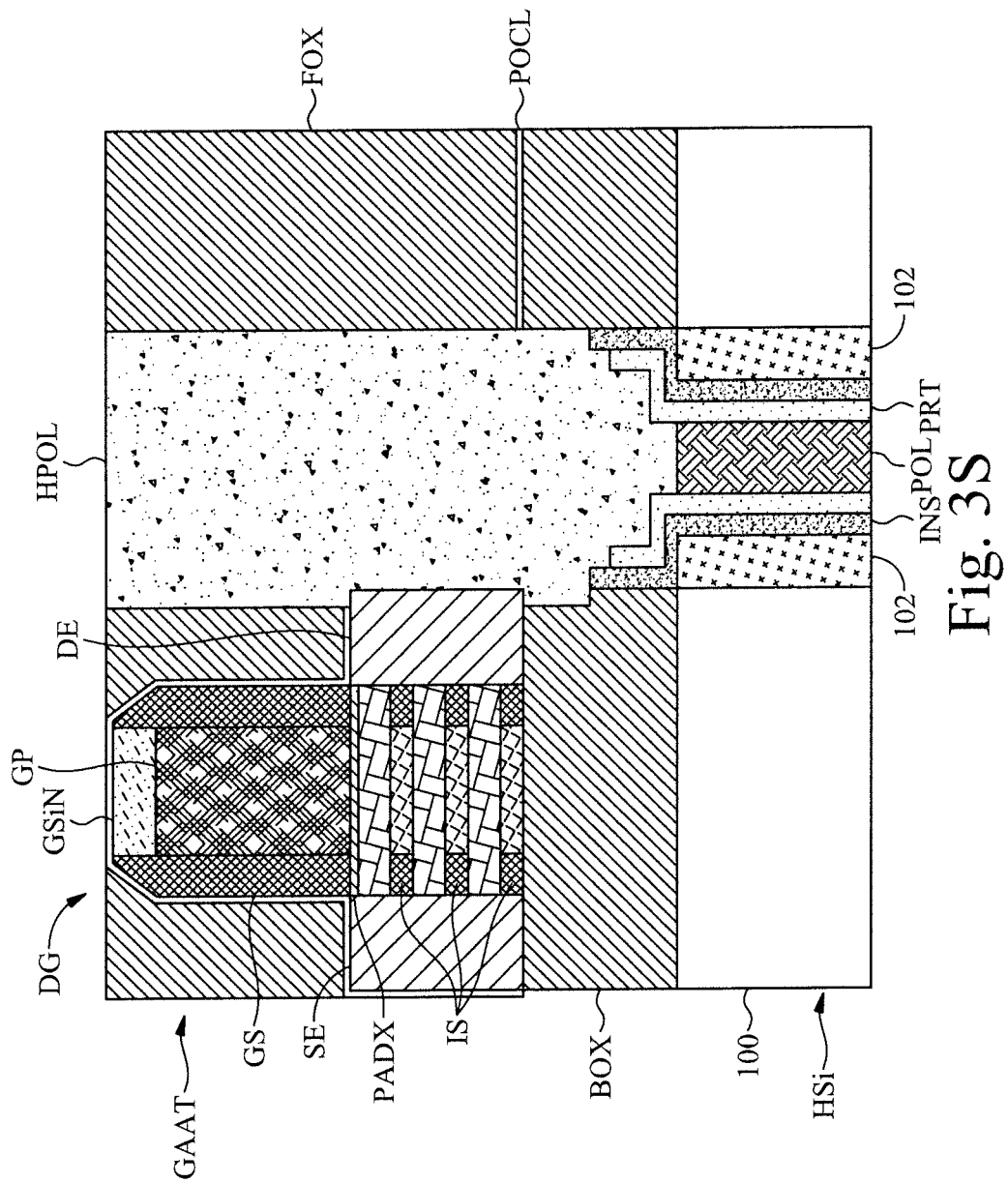

Please refer to FIG. 3S. In any one of the embodiments of the present disclosure, the method S10 includes the following steps of: filling a heavily doped poly HPOL as the conductor COND; and performing the CMP process or the RIE process to stop on the SiN layer SiN.

Figure 3T:
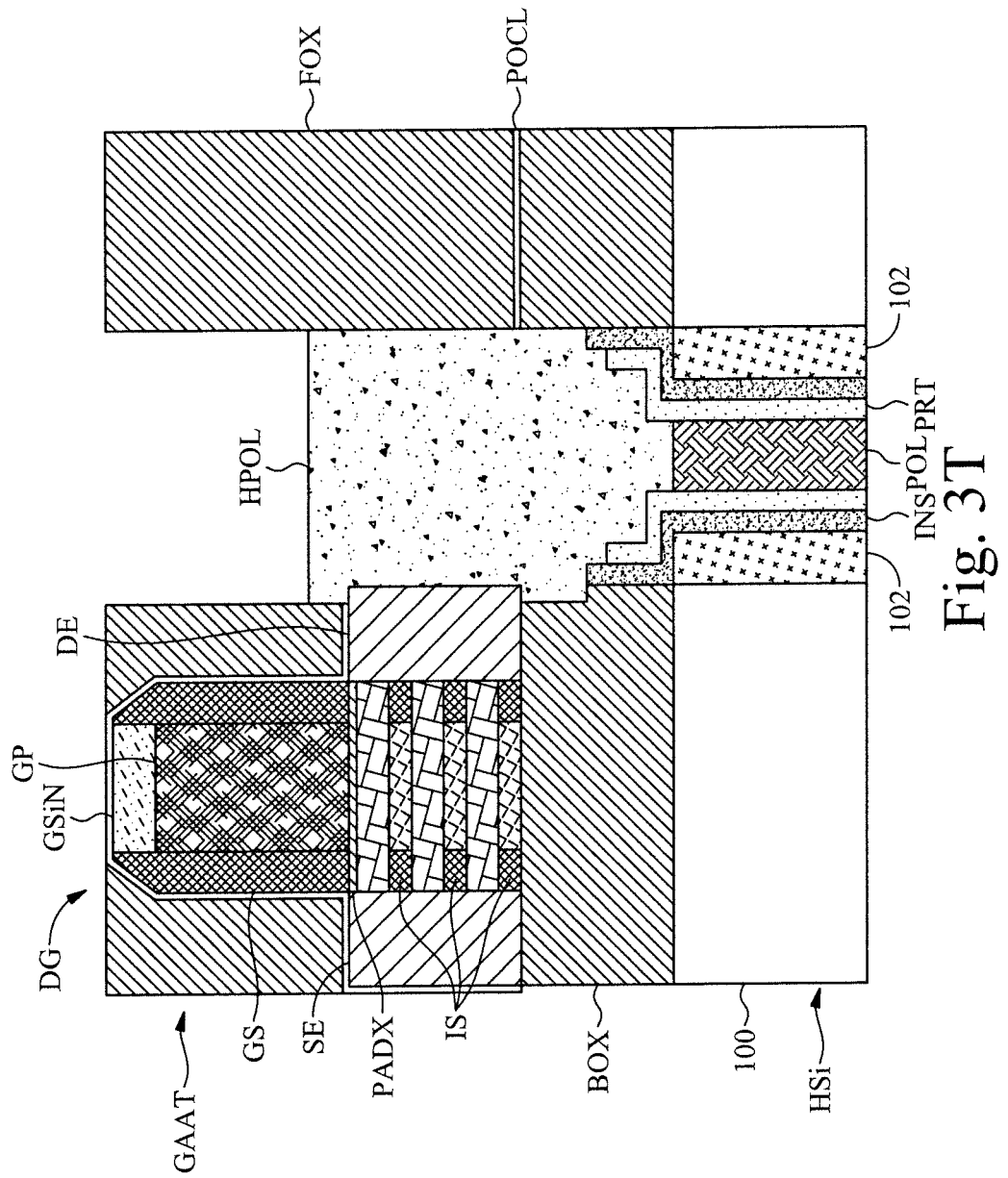

Please refer to FIG. 3T. In any one of the embodiments of the present disclosure, the method S10 includes the step of: recessing a part of the heavily doped poly HPOL.

Figure 3U:
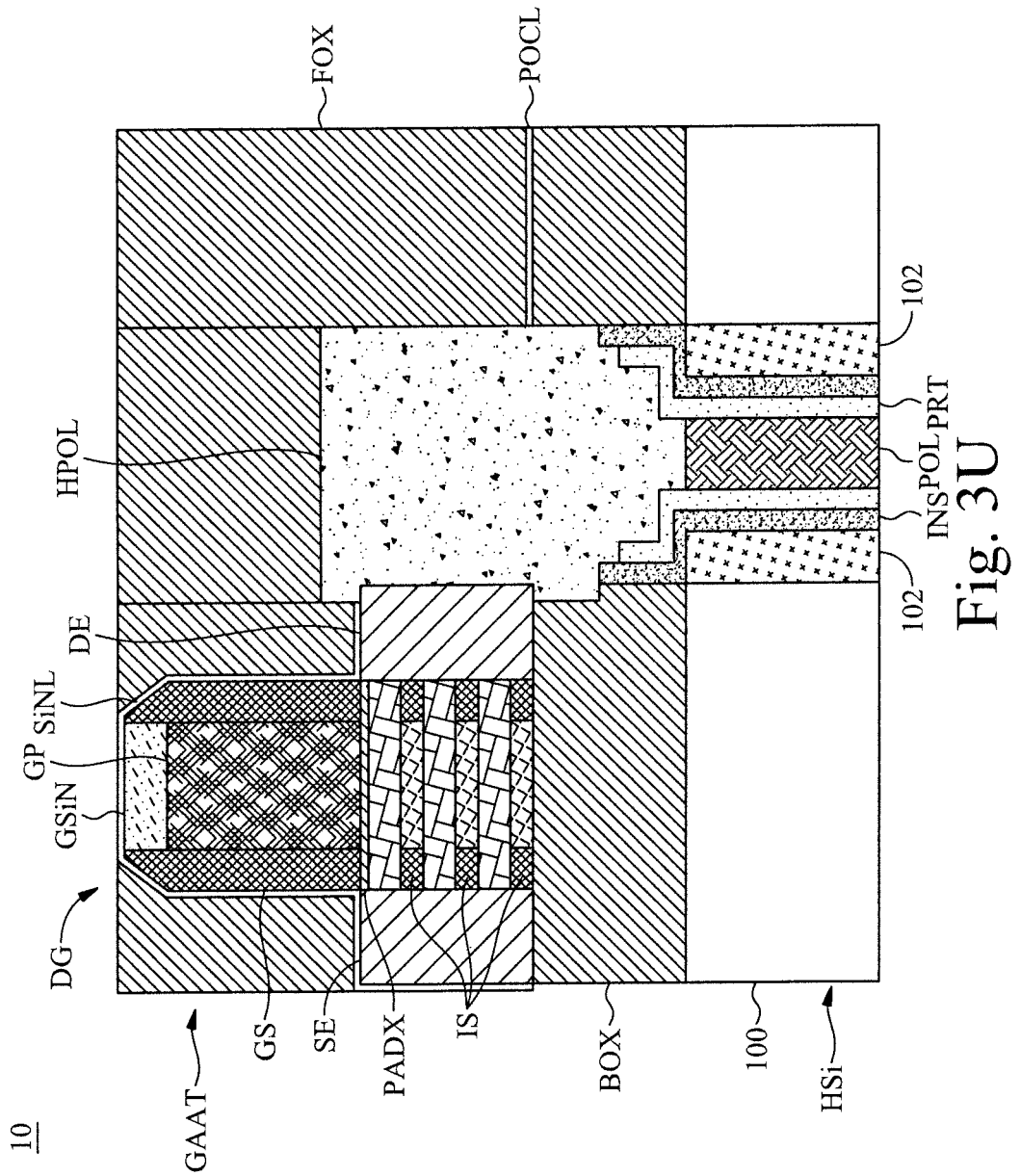

Please refer to FIG. 3U. In any one of the embodiments of the present disclosure, the method S10 includes the following steps of: filling with the field oxide FOX; and performing the CMP process to stop on an SiN liner SiNL.

Figure 3V:
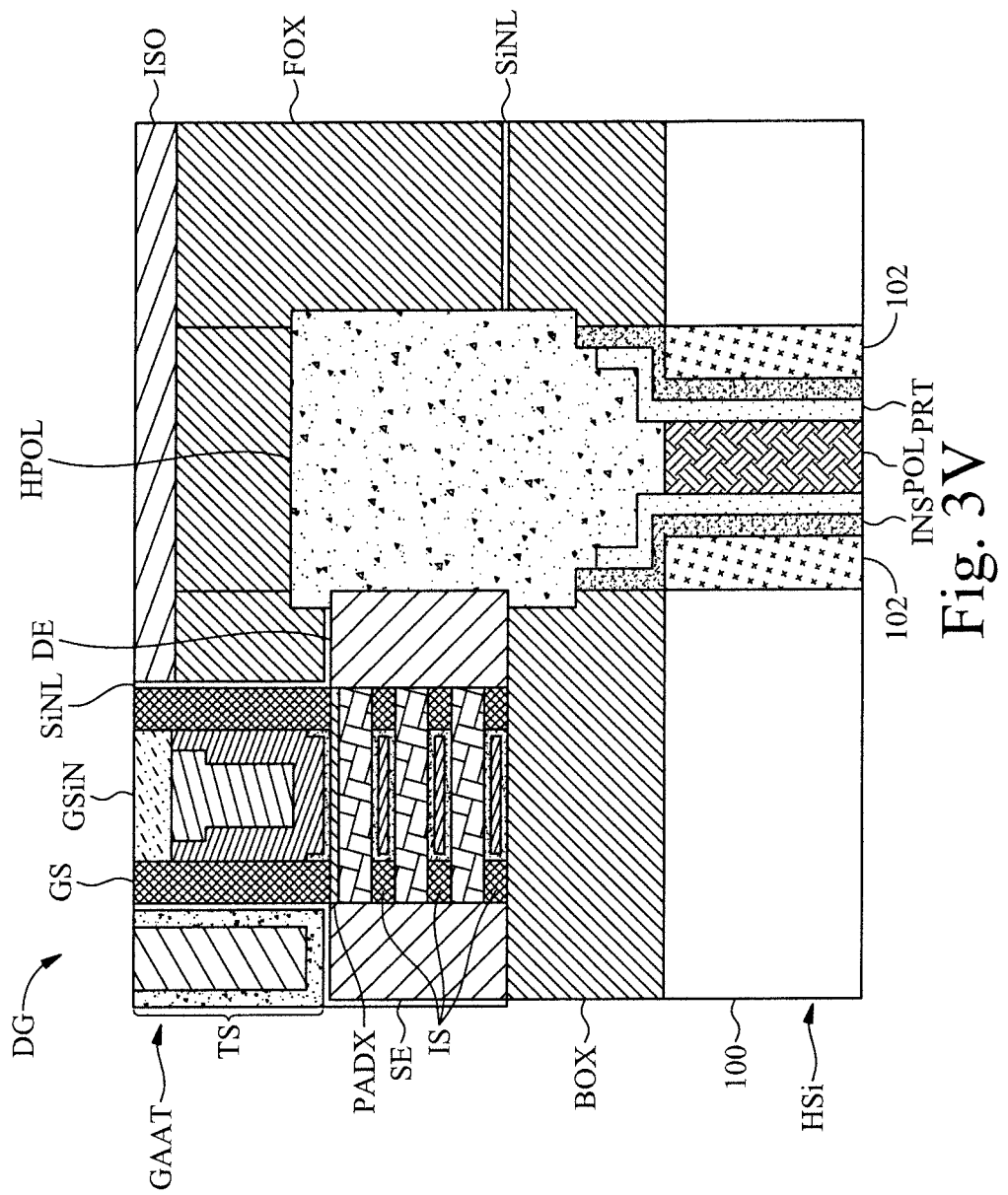

Please refer to FIG. 3V. In any one of the embodiments of the present disclosure, the method S10 includes the step of: forming an isolation layer ISO above the field oxide and a tungsten structure TS between the gate spacer GS and one of the gate DG and the source SE. In FIG. 3V, the semiconductor device 10 for the volatile memory VM having a gate-all-around transistor GAAT is formed, also shown in FIG. 1B, and can be applied to a memory cell or a memory array.

Figure 4A:
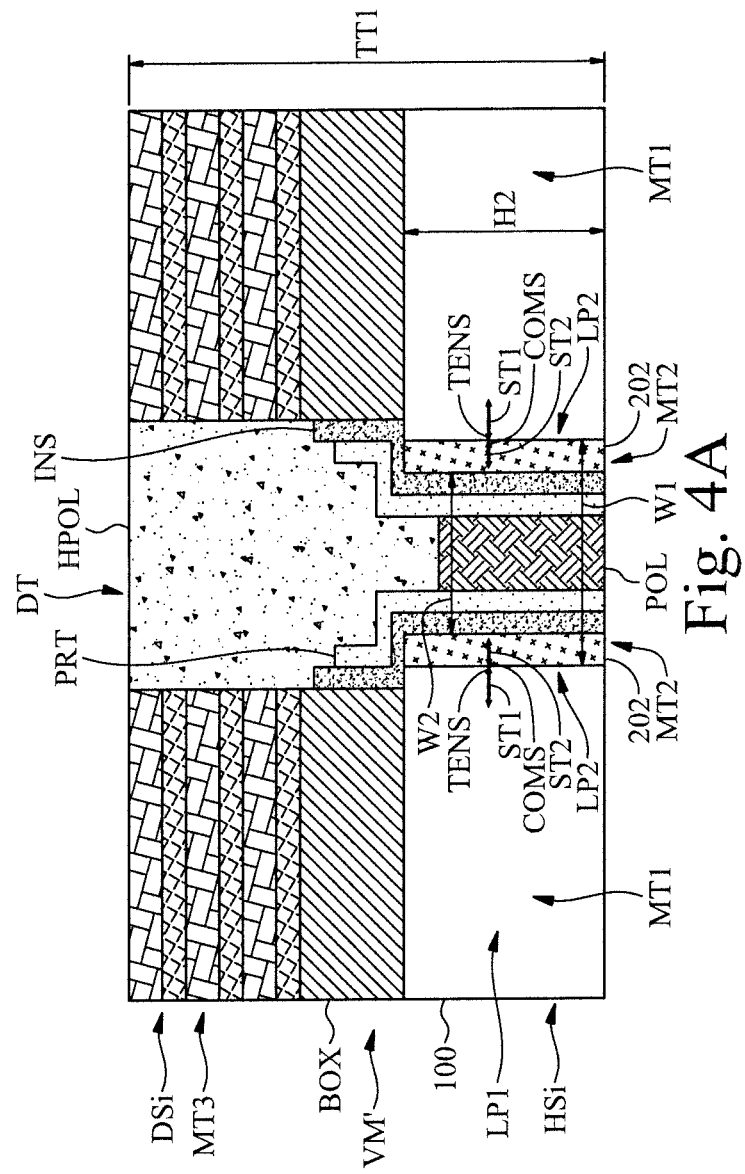
FIG. 4A is a schematic diagram showing another semiconductor device for another volatile memory according to a preferred embodiment of the present disclosure.

Please refer to FIG. 4A, which is a schematic diagram showing another semiconductor device 20 for another volatile memory VM' according to a preferred embodiment of the present disclosure. The semiconductor device 20 includes a substrate 100, a side wall 101 and an epitaxial liner 102. The substrate 100 has a first height H1, and is made of a first material MT1 having a first lattice parameter LPL. The side wall 101 defines a deep trench DT, and has a first stress ST1. The epitaxial liner 102 is made of a second material MT2 having a second lattice parameter LP2, is disposed around the side wall 101, has a second stress ST2 to offset the first stress ST1, and has a second height H2 having a level the same as that of the first height H1, wherein the first and the second lattice parameters LP1 and LP2 are associated with the first stress ST1 of the side walls 101.

Figure 4B:
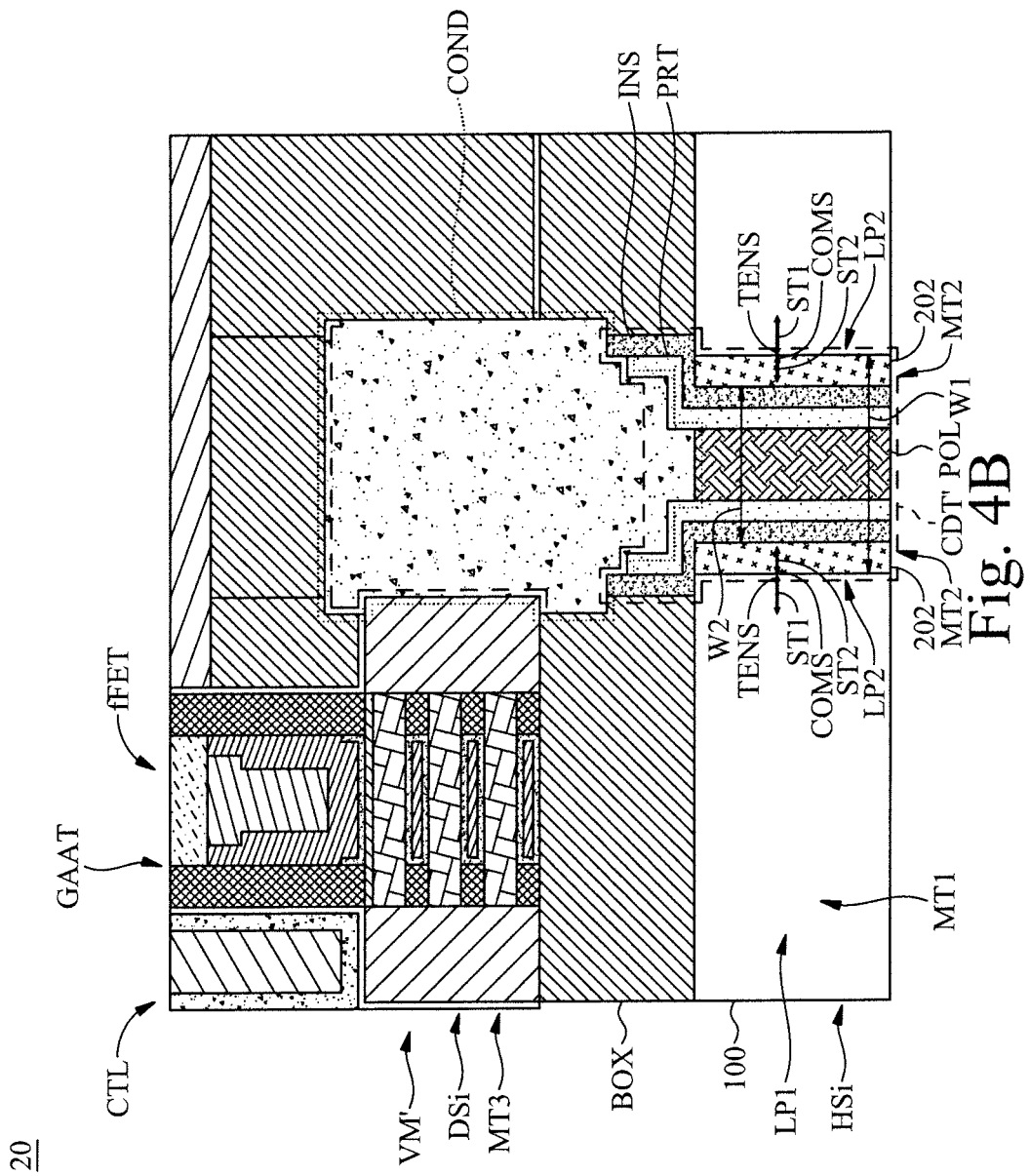
FIG. 4B is a schematic diagram showing another volatile memory having the control logic circuit and the conductor according to a preferred embodiment of the present disclosure.

Please refer to FIG. 4B, which is a schematic diagram showing another volatile memory VM' having the control logic circuit CTL and the conductor COND according to a preferred embodiment of the present disclosure. The volatile memory VM' can include the control logic circuit CTL. For example, a switch or a transistor, included in the control logic circuit CTL, is controlled for the volatile memory VM' to store, write, delete or amend data. The volatile memory VM' can be a dynamic RAM including another capacitor CDT', and further includes the conductor COND and a fin FET fFET. For example, the fin FET fFET is a gate-all-around transistor GAAT. The manufacturing of the capacitor CDT' in the volatile memory VM' will be described firstly, and then the process for connecting the capacitor CDT and a gate-all-around transistor GAAT via the conductor COND will be described later. The capacitors CDT and CDT' are different due to the different thickness (or width) of the epitaxial liner 102.

Please refer to FIGS. 5A-5K, which are schematic diagrams showing another details of the method S10 of manufacturing a semiconductor device 20 for a volatile memory VM' according to a preferred embodiment of the present disclosure. The substrate 100 is a handle Si layer HSi; a buried oxide layer BOX is formed above the handle Si layer HSi; and a device Si layer DSi is formed above the buried oxide layer BOX.

In any one of the embodiments of the present disclosure, the semiconductor device 20 starts with a silicon on insulator wafer SOIW. Please refer to FIG. 5A. The method S10 further includes the following steps of: depositing sequentially a pad oxide layer PADX, a SiN layer SiN and an oxide hard mask layer XHM on the device Si layer DSi. For illustrations, the thicknesses of the buried oxide layer BOX, the pad oxide layer PADX, the SiN layer SiN and the oxide hard mask layer XHM are 3-200 nm, 0.3-10 nm, 20-150 nm and 200-1000 nm respectively, and the thickness of the handle Si His is 1000-6000 nm. The device Si DSi may include multiple SiGe and Si interlaced with each other to form stack layers, each of which has a thickness 3-60 nm.

Figure 5A:
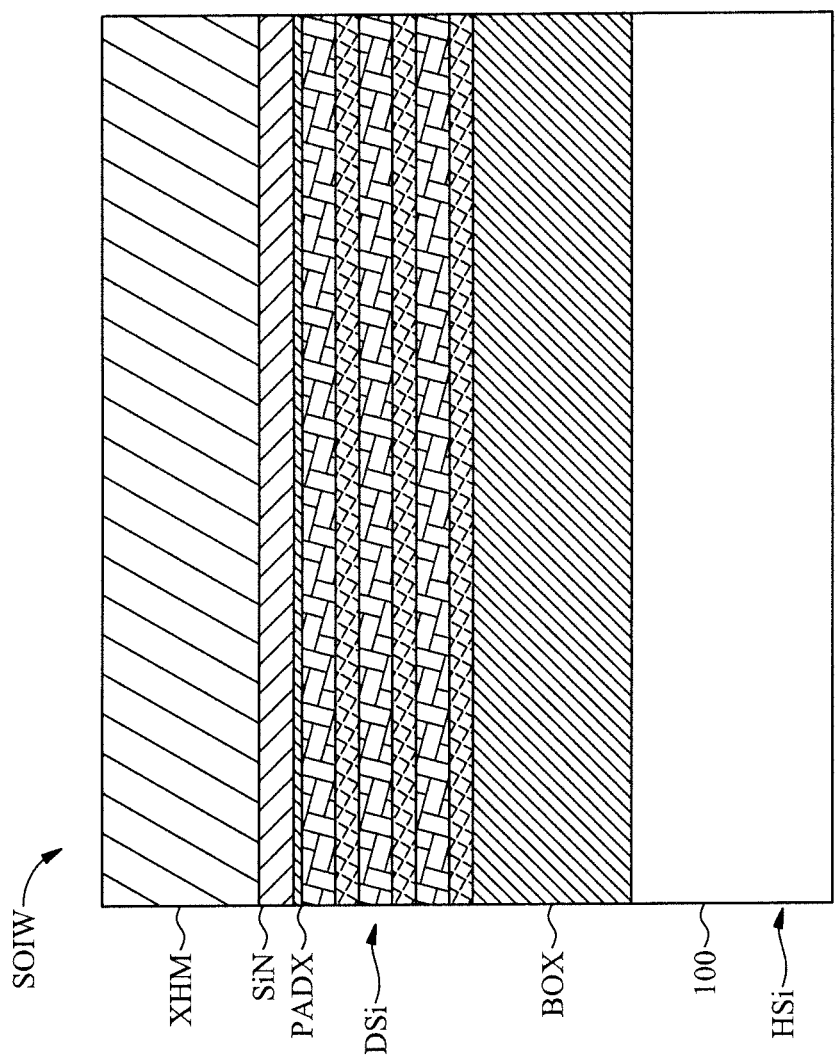
Figure 5B:
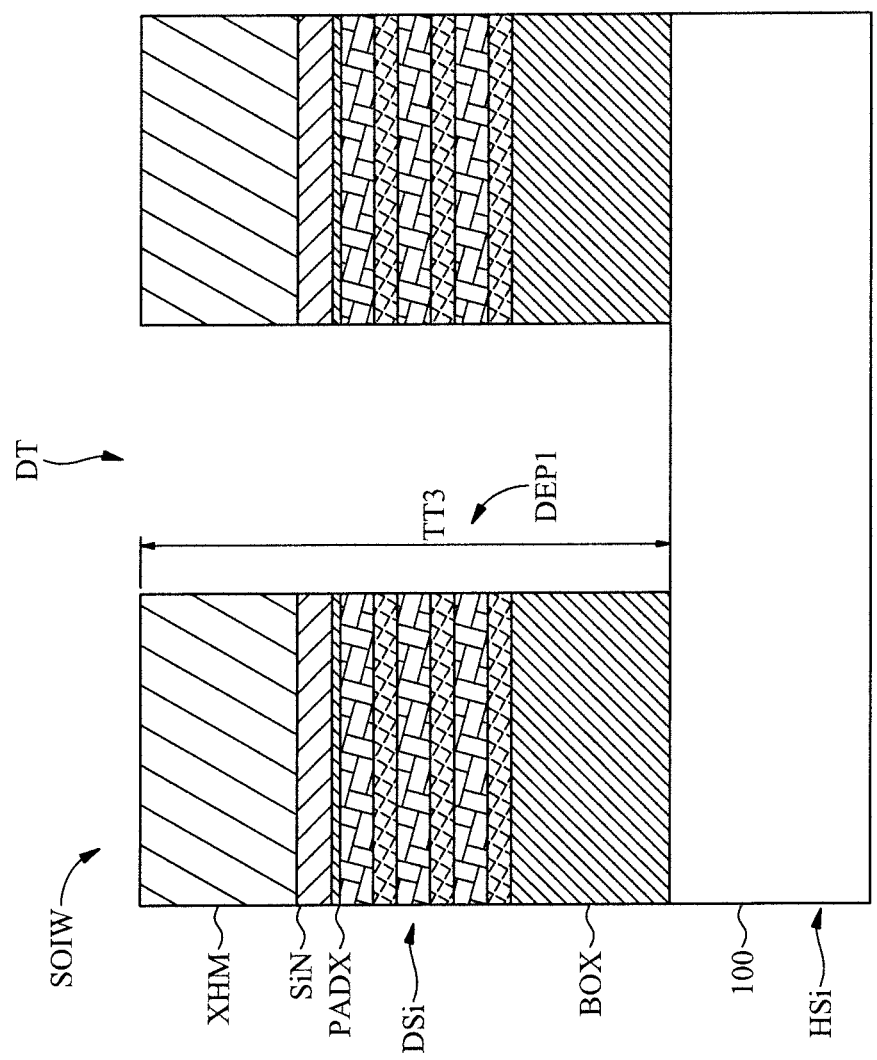

Please refer to FIG. 5B. In any one of the embodiments of the present disclosure, the method S10 further includes the step of: etching the handle Si layer HSi, the buried oxide layer BOX, the device Si layer DSi, the pad oxide layer PADX, the SiN layer SiN, and the oxide hard mask layer XHM to a first target thickness TT3 to form a first depth DEP1 of the deep trench DT by a Reactive-Ion Etching (RIE) process. For example, the first depth DEP1 of the deep trench DT is a total sum of the thicknesses of the buried oxide layer BOX, the device Si DSi, the pad oxide layer PADX, the SiN layer SiN and the oxide hard mask layer XHM.

Figure 5C:
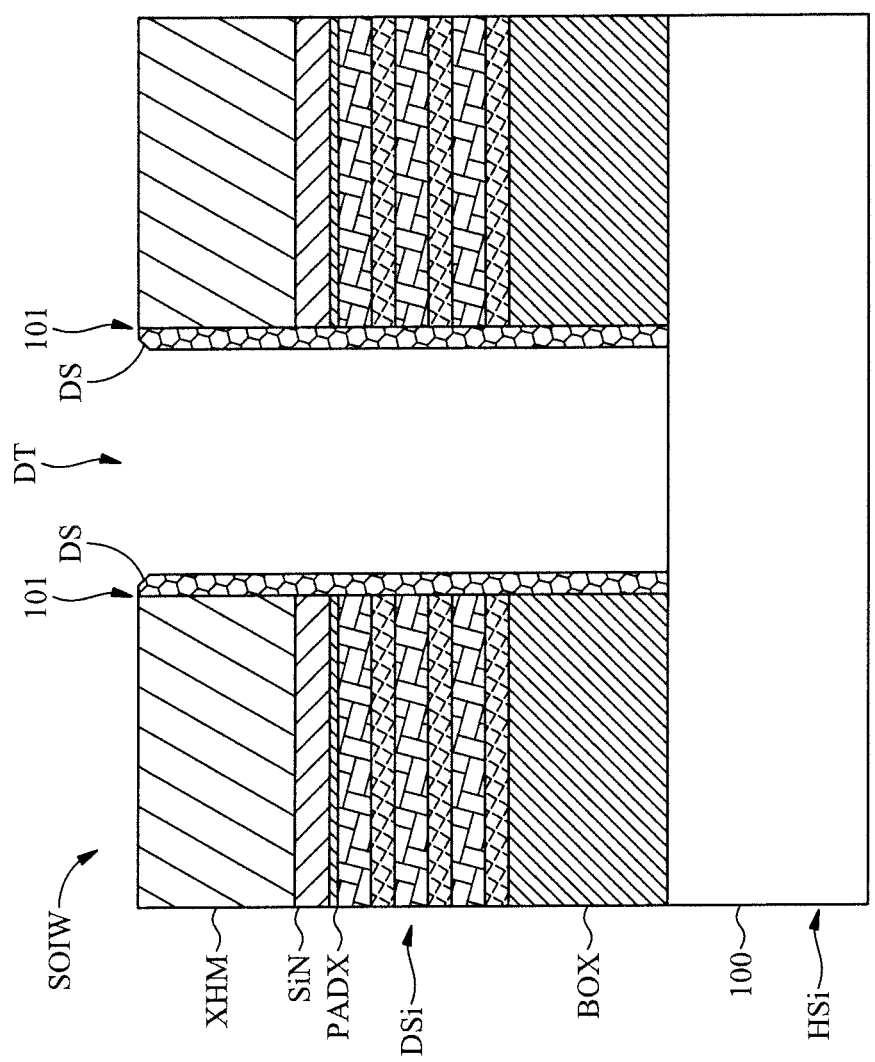

Please refer to FIG. 5C. In any one of the embodiments of the present disclosure, the method S10 further includes the step of: forming a dielectric spacer DS above the handle Si layer HSi and on the side wall 101.

Figure 5D:
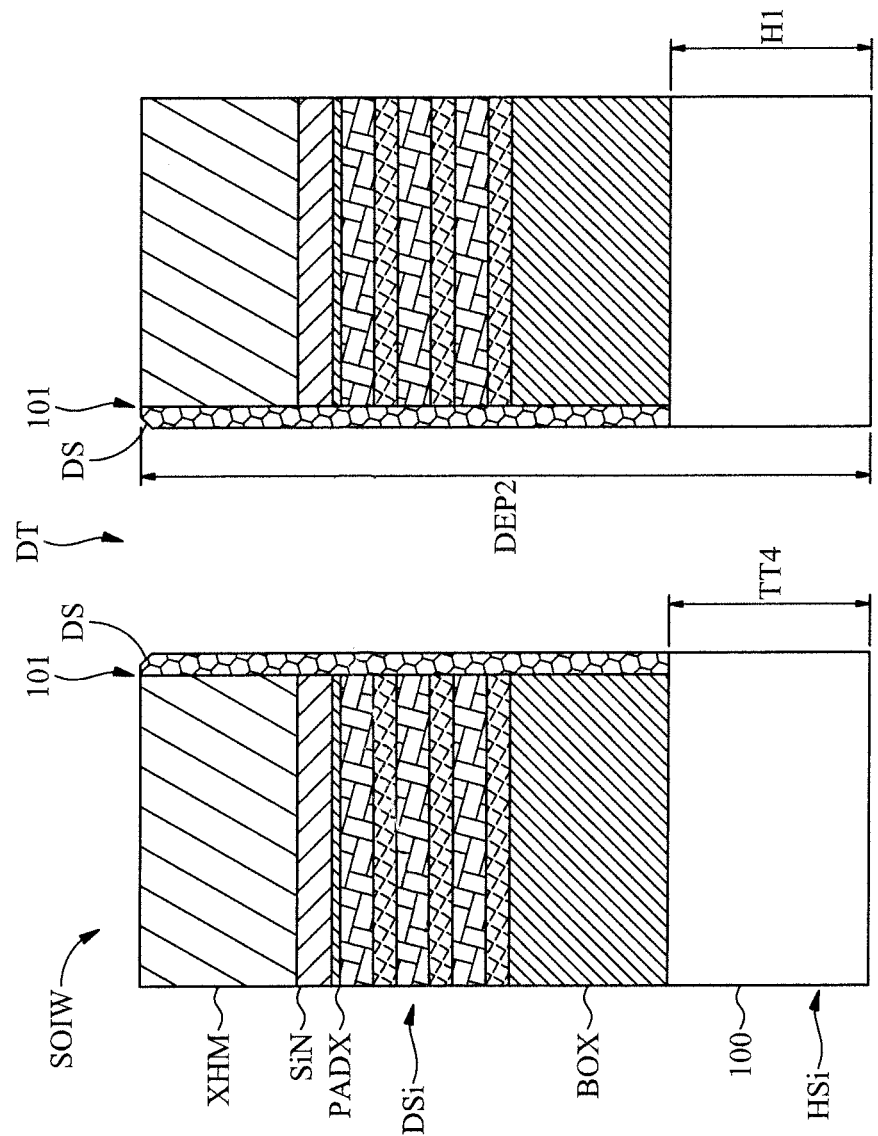

Please refer to FIG. 5D. In any one of the embodiments of the present disclosure, the method S10 includes the step of: recessing the handle Si layer HSi to a second target thickness TT4 to form a second depth DEP2 of the deep trench DT, wherein the second target thickness TT4 equals the first height H1.

Figure 5E:
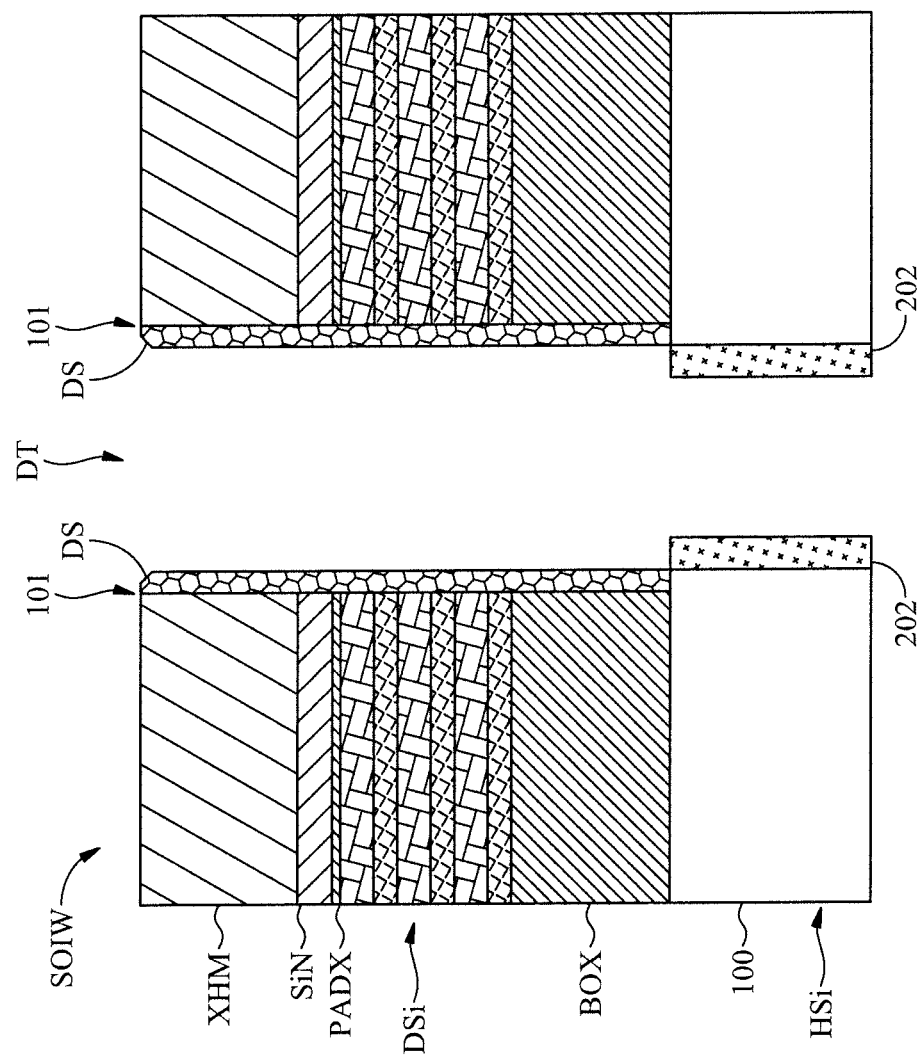

Please refer to FIG. 5E. In any one of the embodiments of the present disclosure, the method S10 includes the step of: depositing the epitaxial liner 202 around the handle Si layer HSi.

Figure 5F:
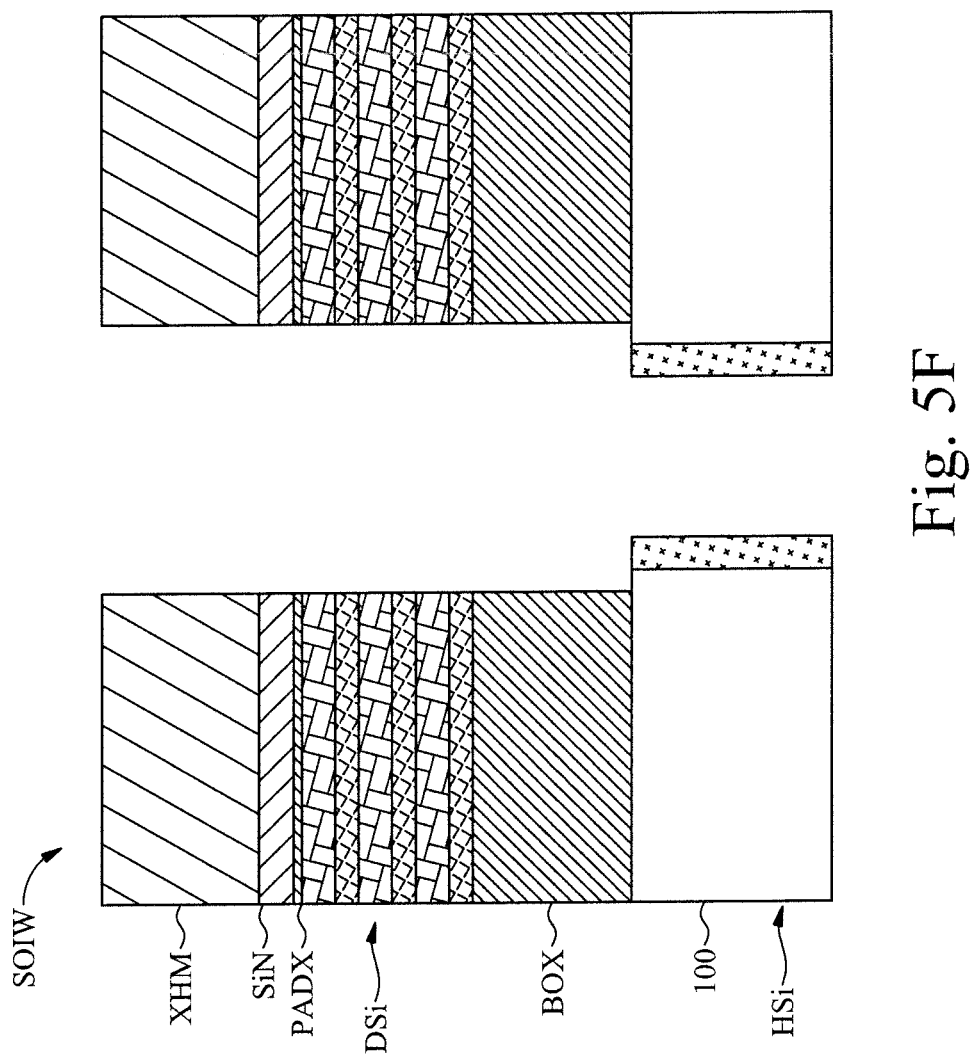

Please refer to FIG. 5F. In any one of the embodiments of the present disclosure, the method S10 includes the step of: stripping the dielectric spacer DS.

Figure 5G:
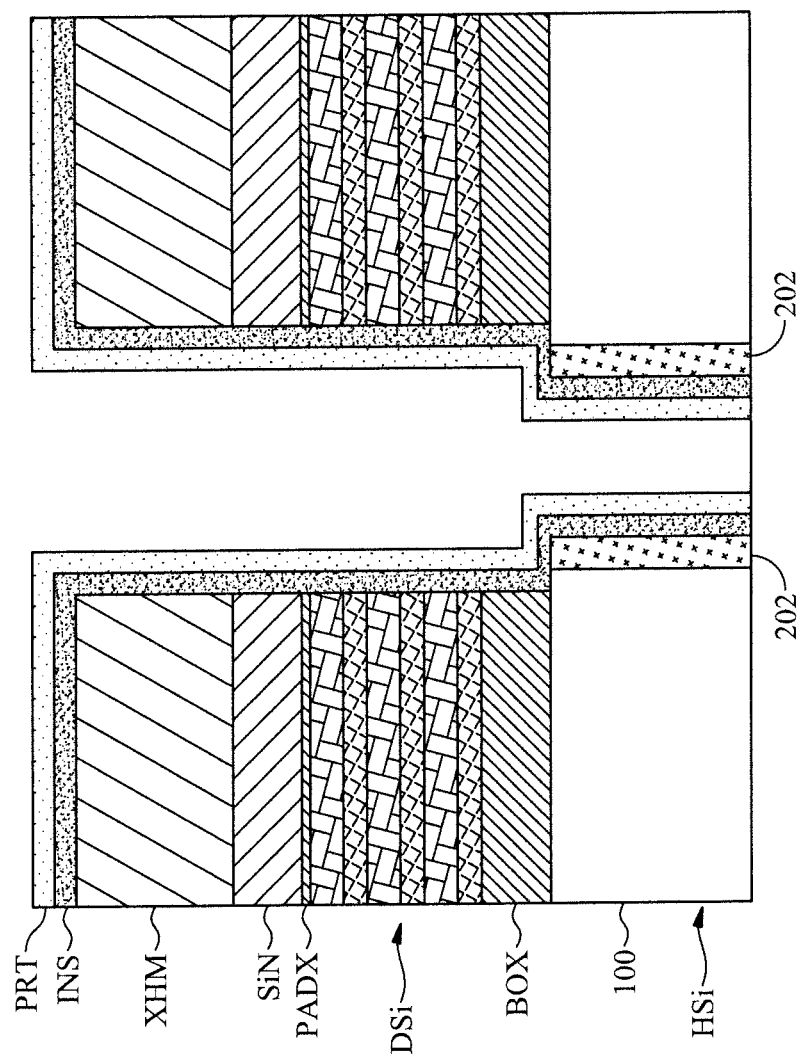

Please refer to FIG. 5G. In any one of the embodiments of the present disclosure, the method S10 includes the step of: depositing an insulation structure INS and a protecting layer PRT on the epitaxial liner 202 and the side wall 102, wherein the protecting layer PRT includes TiN.

Please refer to FIG. 5H. In any one of the embodiments of the present disclosure, the method S10 includes the step of: depositing a poly silicon POL on the insulation structure INS and the protecting layer PRT; for illustrations, the thickness of the poly silicon POL above the protection layer PRT is 200-1000 nm.

Figure 5I:
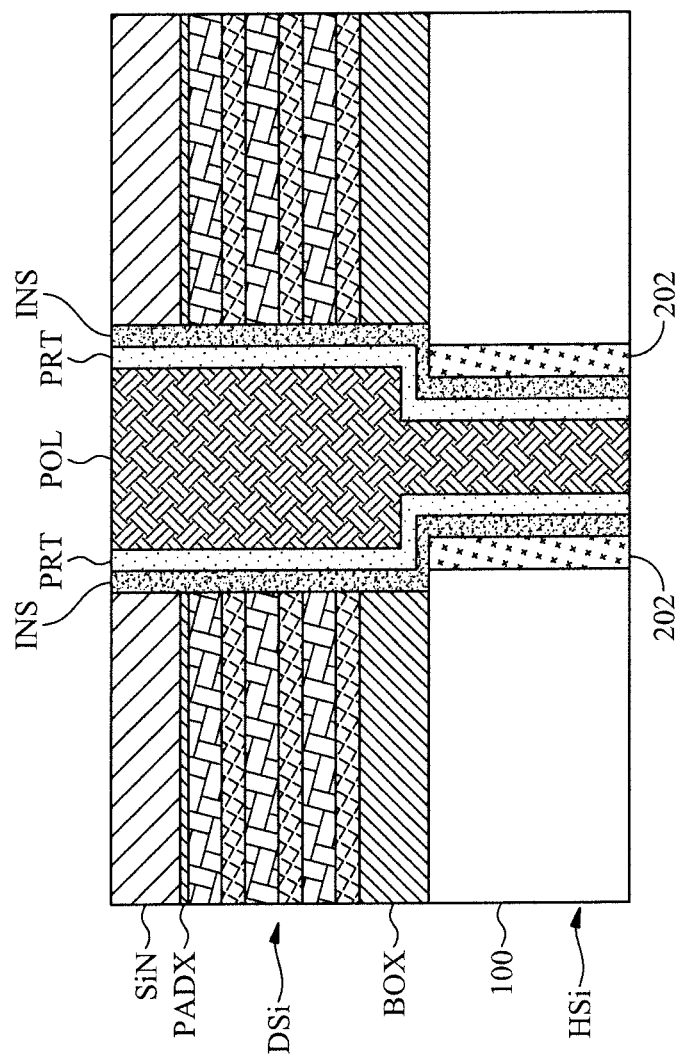

Please refer to FIG. 5I. In any one of the embodiments of the present disclosure, the method S10 includes the step of: performing a chemical mechanical polishing (CMP) process by starting from the poly silicon POL and stopping on the SiN layer SiN.

Figure 5J:
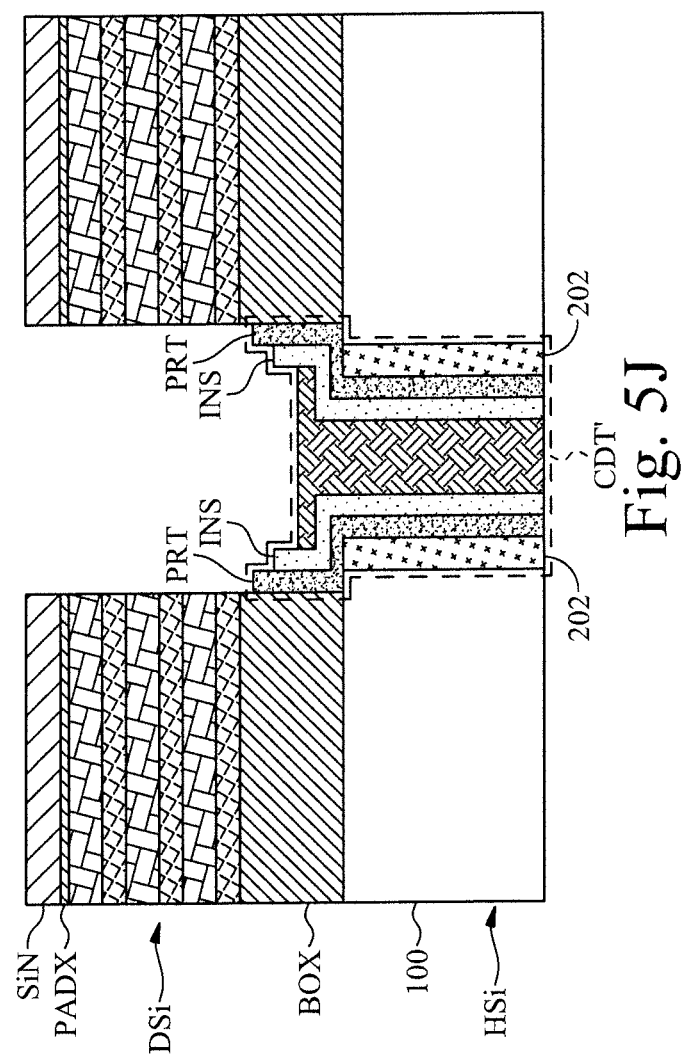

Please refer to FIG. 5J. In any one of the embodiments of the present disclosure, the method S10 includes the step of: recessing a part of the polished poly silicon POL, a part of the polished TiN and a part of the polished insulator structure INS.

Please refer to FIG. 5K. In any one of the embodiments of the present disclosure, the method S10 includes the following steps of: filling the deep trench DT with a high dope poly HPOL; and performing the CMP process by starting from the SiN layer SiN and stopping on the device Si layer DSi. In FIG. 5K, the semiconductor device 20 for the volatile memory VM', also shown in FIG. 4A, can be applied to both bulk, SOI having different crystal orientation, for example, SiGe or Si orientation.

Figure 6A:
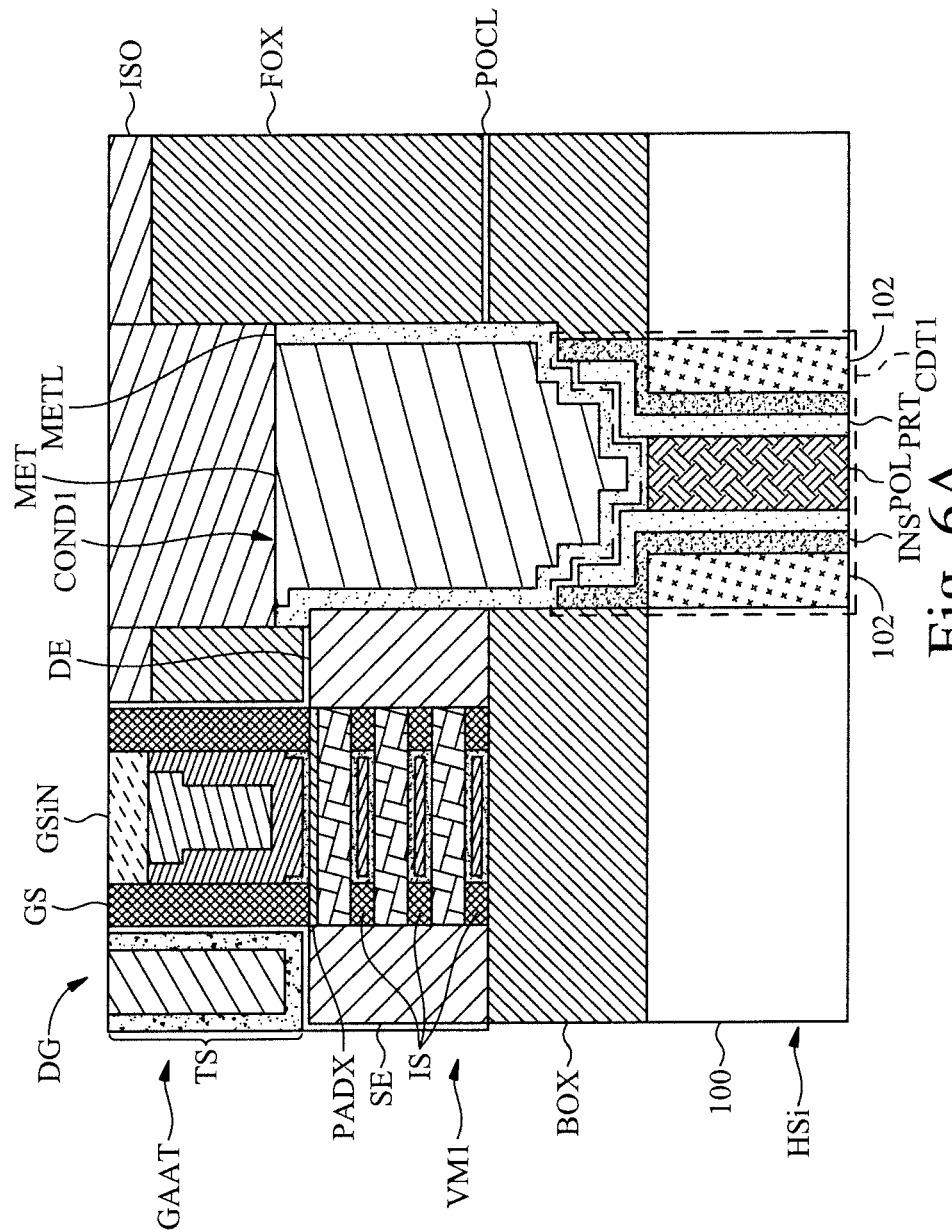
FIG. 6A is a schematic diagram showing another volatile memory having the control logic circuit and another conductor according to a preferred embodiment of the present disclosure.

Please refer to FIG. 6A, which is a schematic diagram showing another volatile memory VM1 having the control logic circuit CTL and another conductor COND1 according to a preferred embodiment of the present disclosure. The volatile memory VM1 can be a dynamic RAM including the capacitor CDT1, and further includes the conductor COND1 and a fin FET fFET. For example, the fin FET fFET is a gate-all-around transistor GAAT. The manufacturing of the capacitor CDT1 in the volatile memory VM1 can be implemented by referring to FIGS. 3A-3M, the process for forming a gate-all-around transistor GAAT can be implemented by referring to FIGS. 3N-3Q, and then the process for connecting the capacitor CDT1 and a gate-all-around transistor GAAT via the conductor COND1 will be described later, as shown in the following FIGS. 7A-7H The conductors COND in FIG. 4B and COND1 in FIG. 6A are different due to the difference of the materials, the former one is a heavily doped poly, and the later one is a metal.

Figure 6B:
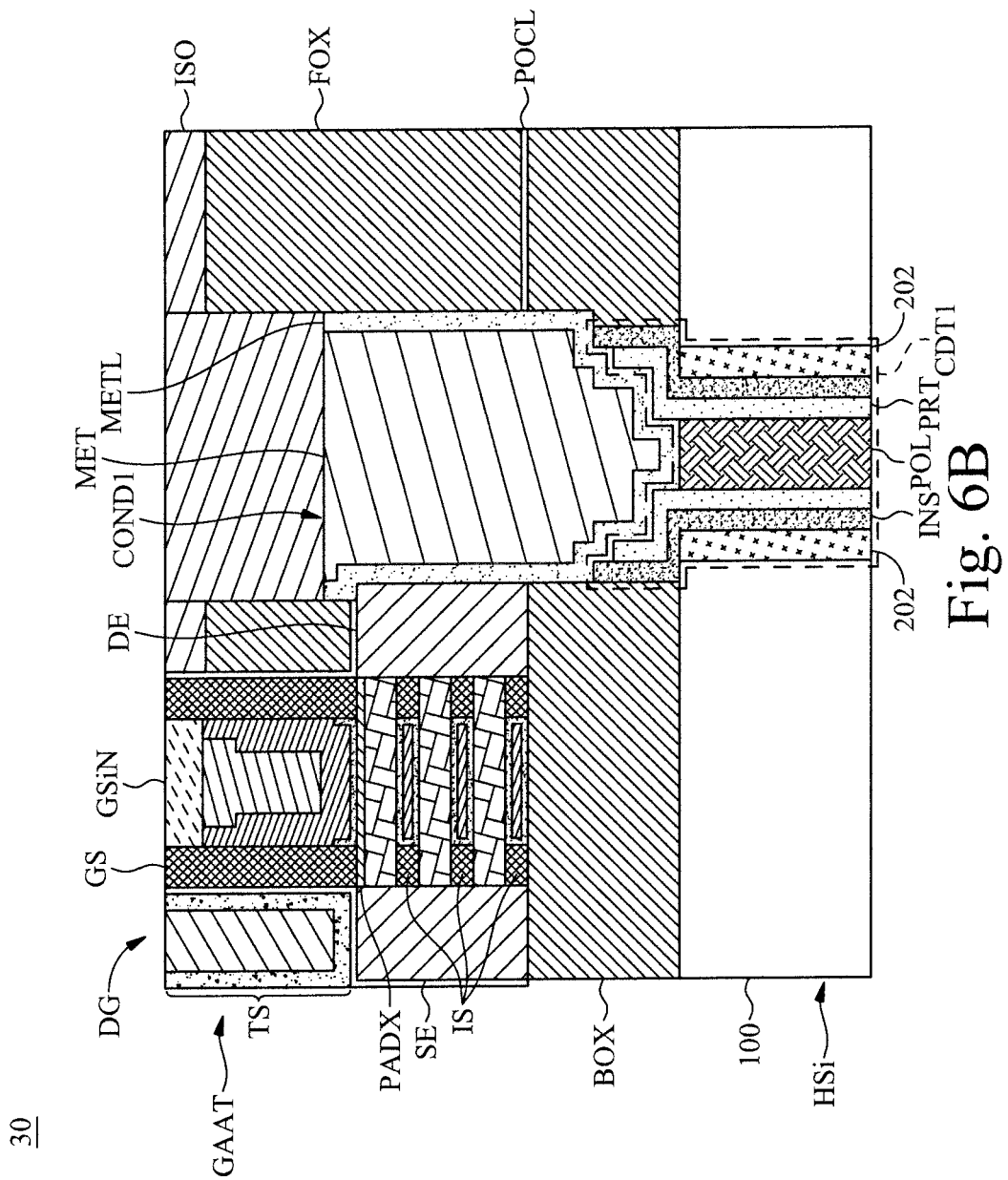
FIG. 6B is a schematic diagram showing another volatile memory having the control logic circuit and another conductor according to a preferred embodiment of the present disclosure.

Please refer to FIG. 6B, which is a schematic diagram showing another volatile memory VM2 having the control logic circuit CTL and another conductor COND1 according to a preferred embodiment of the present disclosure. The volatile memory VM2 can be a dynamic RAM including the capacitor CDT2, and further includes the conductor COND1 and a fin FET fFET. For example, the fin FET fFET is a gate-all-around transistor GAAT. The manufacturing of the capacitor CDT2 in the volatile memory VM2 can be implemented by referring to FIGS. 5A-5K, the process for forming a gate-all-around transistor GAAT can be implemented by referring to FIGS. 3N-3Q, and then the process for connecting the capacitor CDT1 and a gate-all-around transistor GAAT via the conductor COND1 will be described later, as shown in the following FIGS. 7A-7H. The capacitors CDT1 and CDT2 are different due to the different thicknesses (or widths) of the epitaxial liners 102 and 202. In FIGS. 3N-3Q, the processing for forming a gate-all-around transistor GAAT is the same, but only differs due to the different thicknesses (or widths) of the epitaxial liners 102 and 202. In the following FIGS. 7A-7H, the process for forming a gate-all-around transistor GAAT is the same, but only differs due to the different thicknesses (or widths) of the epitaxial liners 102 and 202.

Please refer to FIGS. 7A-7H, which are schematic diagrams showing another details of the method S10 of manufacturing a semiconductor device 30 for a volatile memory VM1 according to a preferred embodiment of the present disclosure. Please refer to FIG. 7A. It is followed by FIG. 3Q, and the method S10 includes the steps of: recessing the field oxide FOX; depositing an isolation layer ISO; and performing the CMP process to stop on the SiN liner SiNL.

Figure 7A:
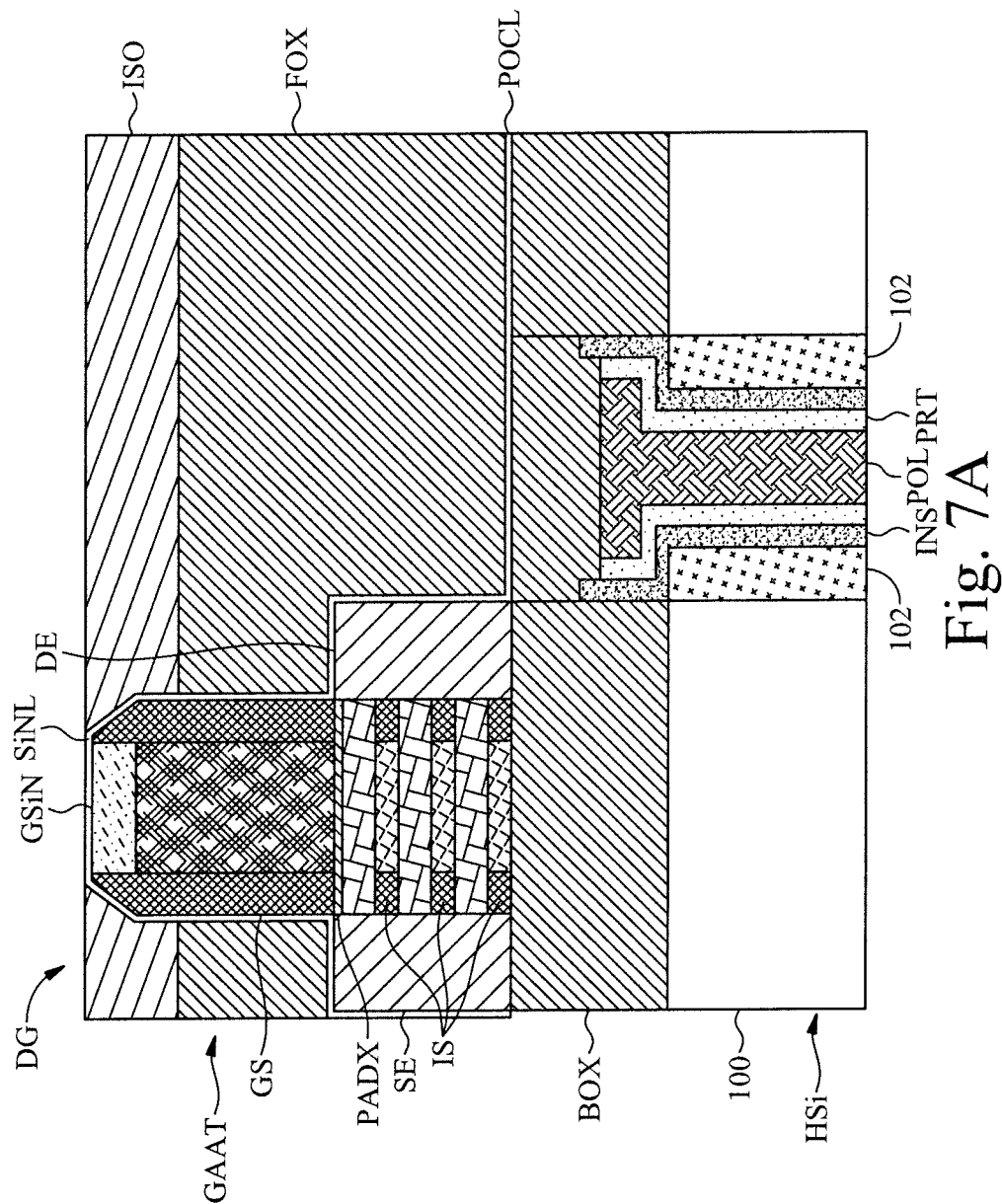
FIG. 7A-7H are schematic diagrams showing another detail of the method of manufacturing a semiconductor device for a volatile memory according to a preferred embodiment of the present disclosure.
Figure 7B:
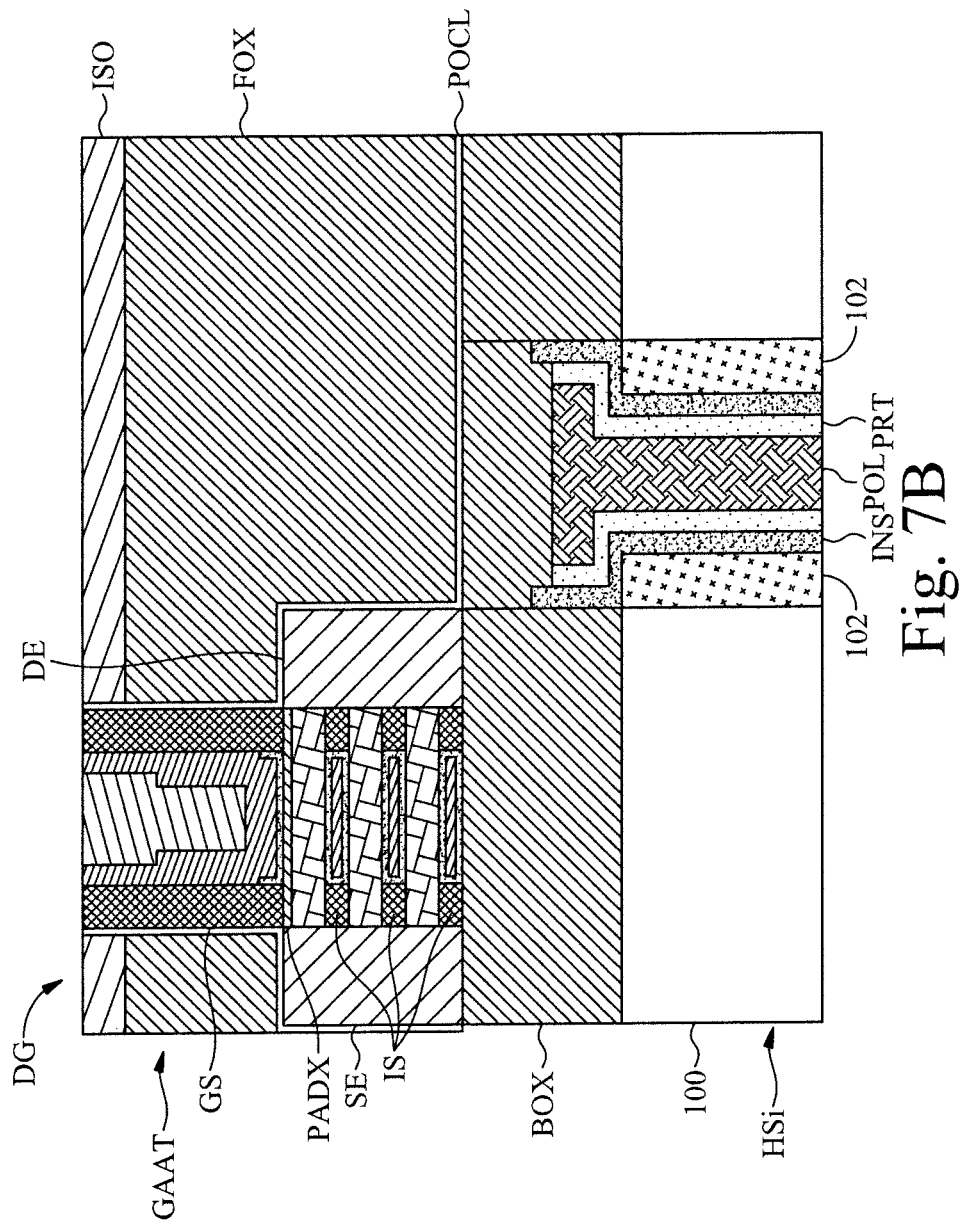

Please refer to FIG. 7B. In any one of the embodiments of the present disclosure, the method S10 includes the steps of: opening the oxide hard mask XHM and the gate SiN GSiN; pulling the gate poly GP and SiGe; depositing a gate insulation layer GI and a gate tungsten (W) in the dummy gate DG; and performing the CMP process to stop on the isolation layer ISO.

Figure 7C:
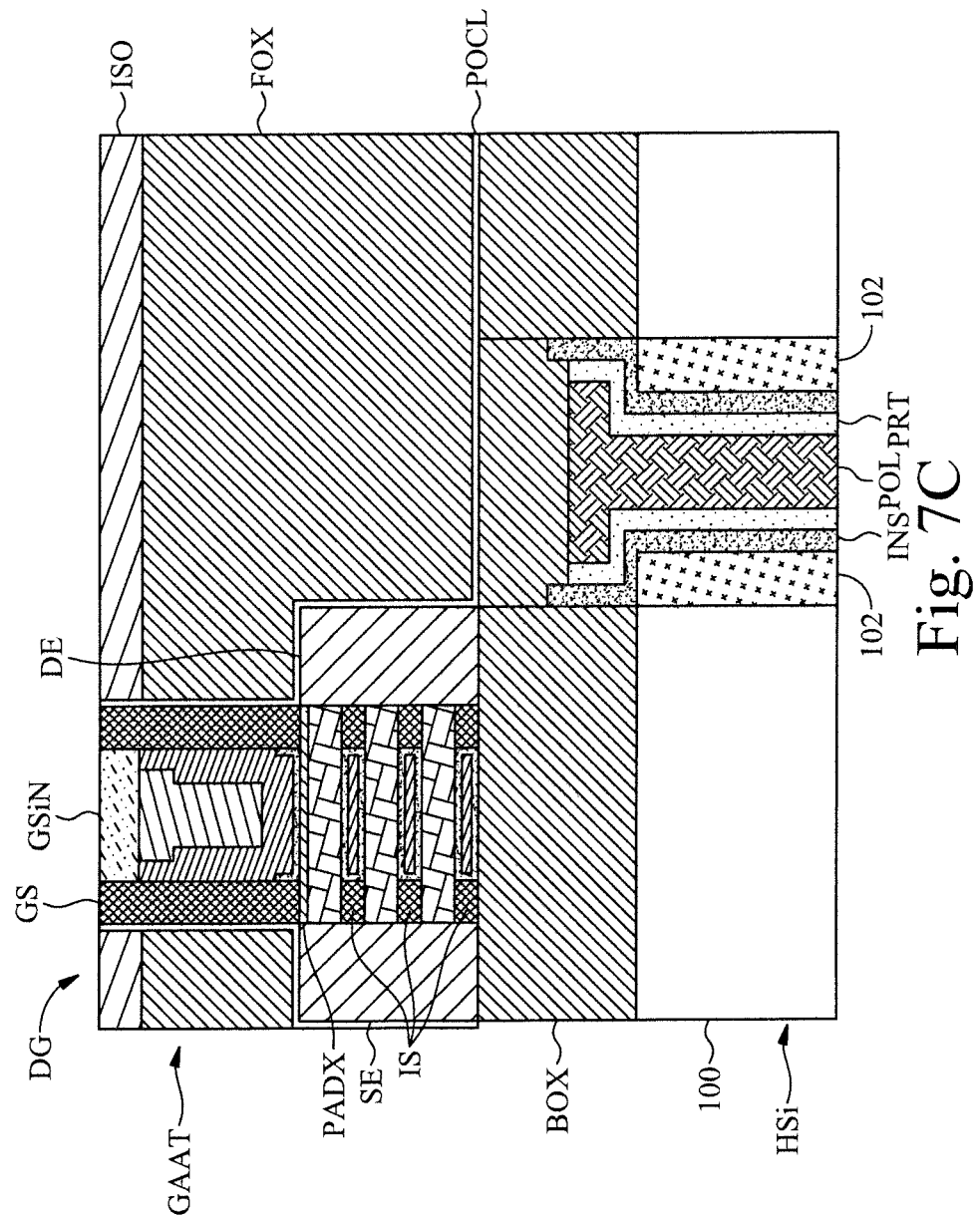

Please refer to FIG. 7C. In any one of the embodiments of the present disclosure, the method S10 includes the steps of: recessing the W in the dummy gate DG; depositing another gate SiN GSiN; and performing the CMP process to stop on the isolation layer ISO.

Figure 7D:
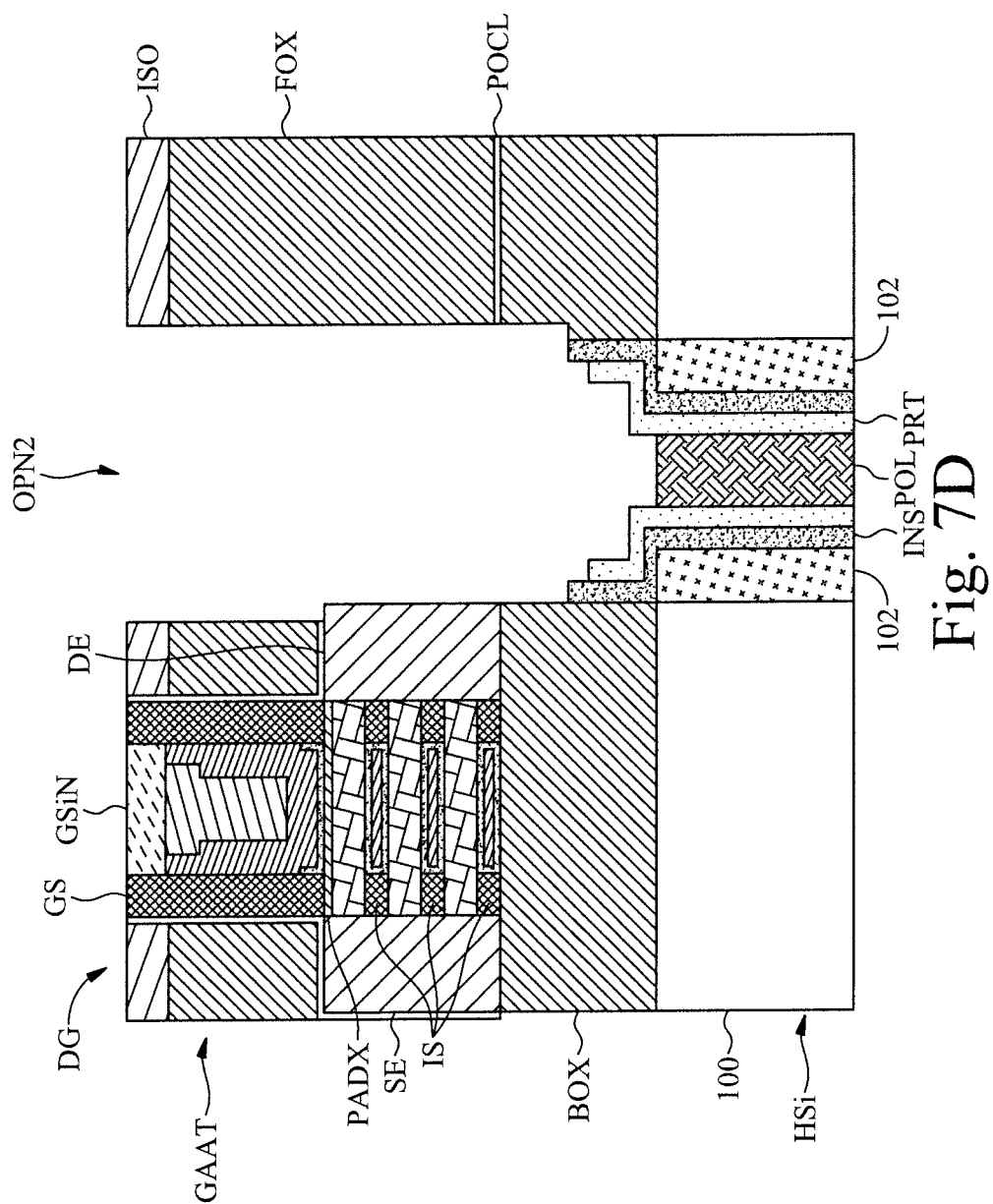

Please refer to FIG. 7D. In any one of the embodiments of the present disclosure, the method S10 includes the step of: performing the RIE process to form a second opening OPN2 for connecting the gate-all-around transistor GAAT and the poly silicon POL.

Figure 7E:
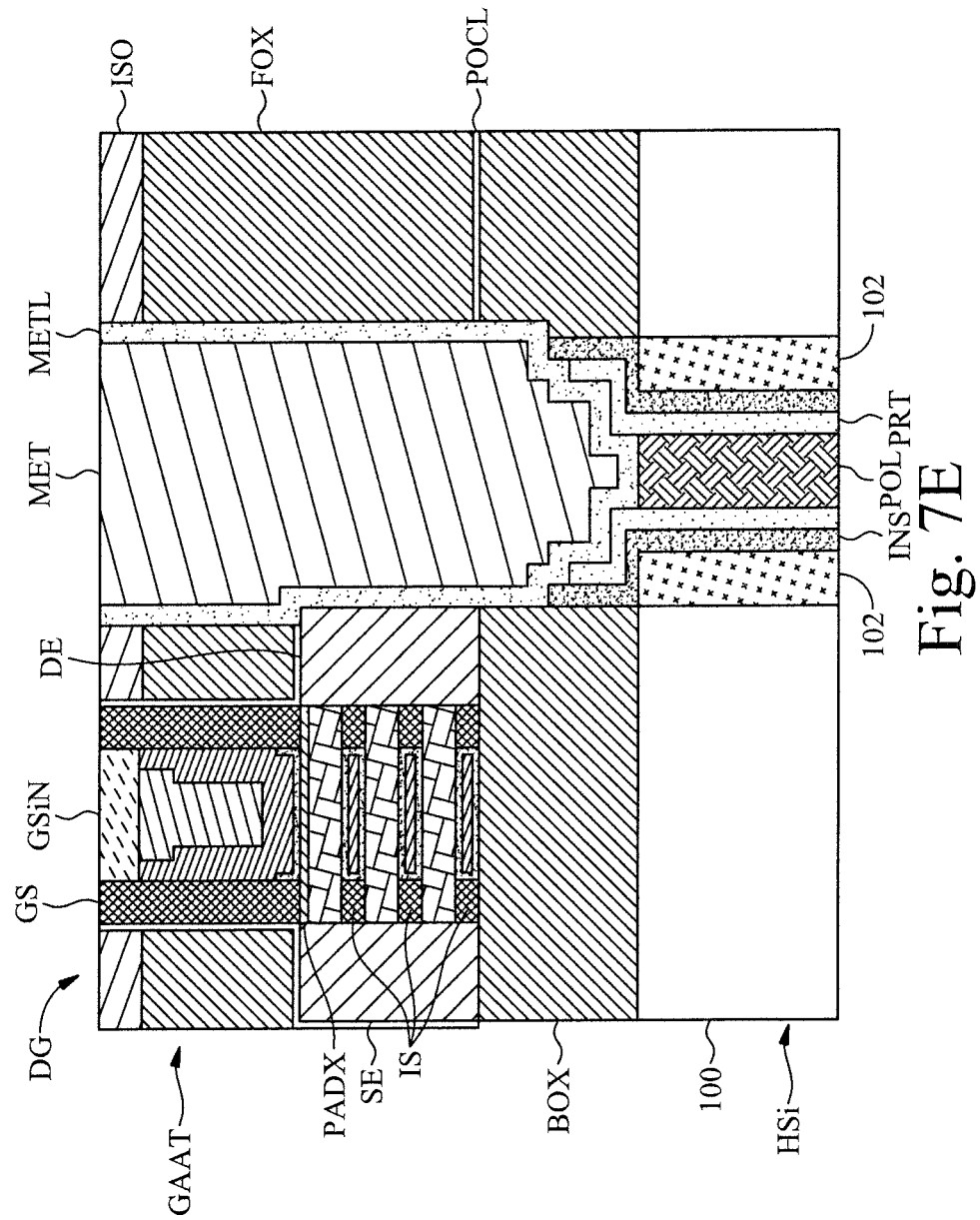

Please refer to FIG. 7E. In any one of the embodiments of the present disclosure, the method S10 includes the steps of: depositing a WSix METL and the W MET; and performing the CMP process to stop on the isolation layer ISO, wherein x represents a Si atom number.

Figure 7F:
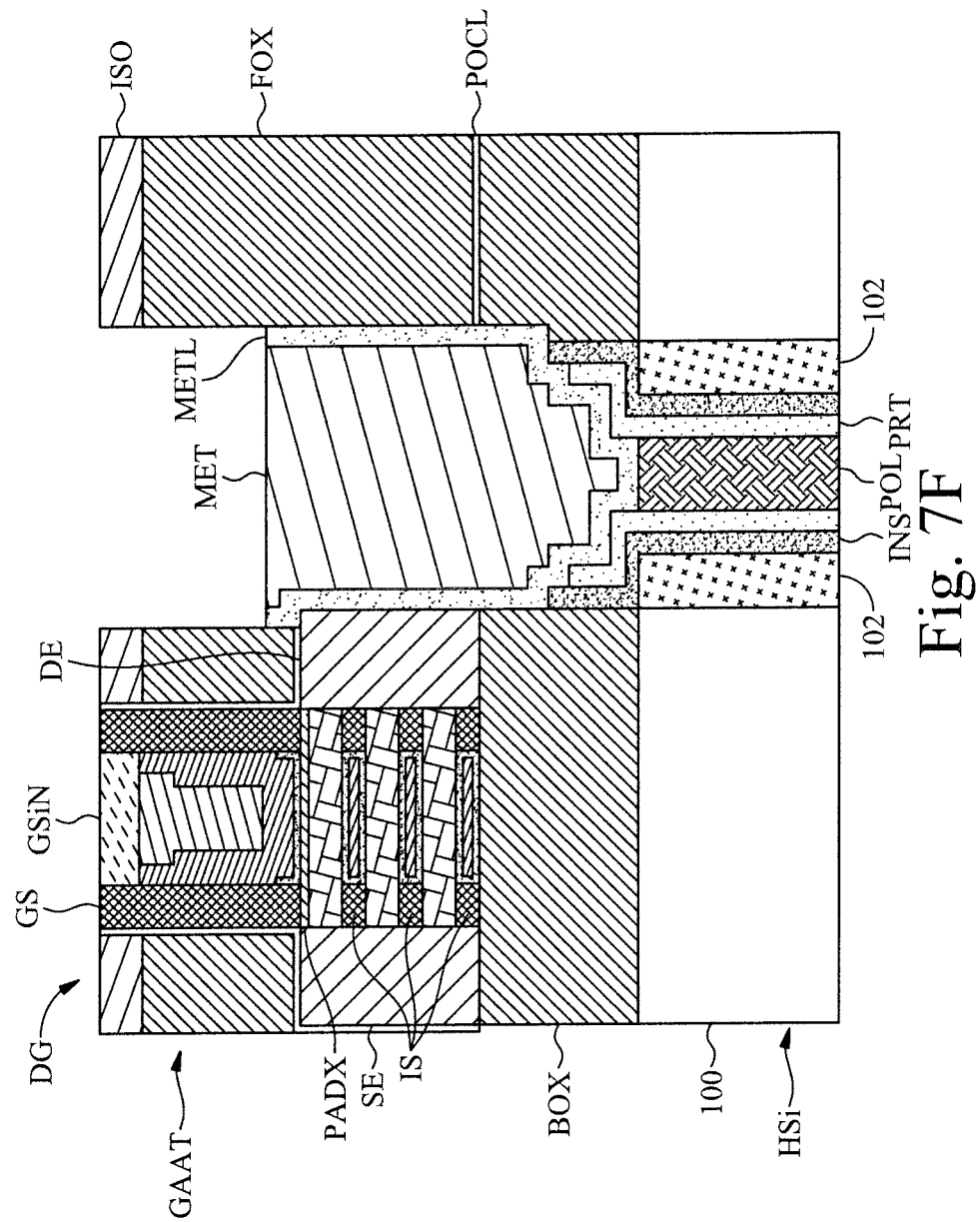

Please refer to FIG. 7F. In any one of the embodiments of the present disclosure, the method S10 includes the step of: recessing parts of the WSix METL and the W MET.

Figure 7G:
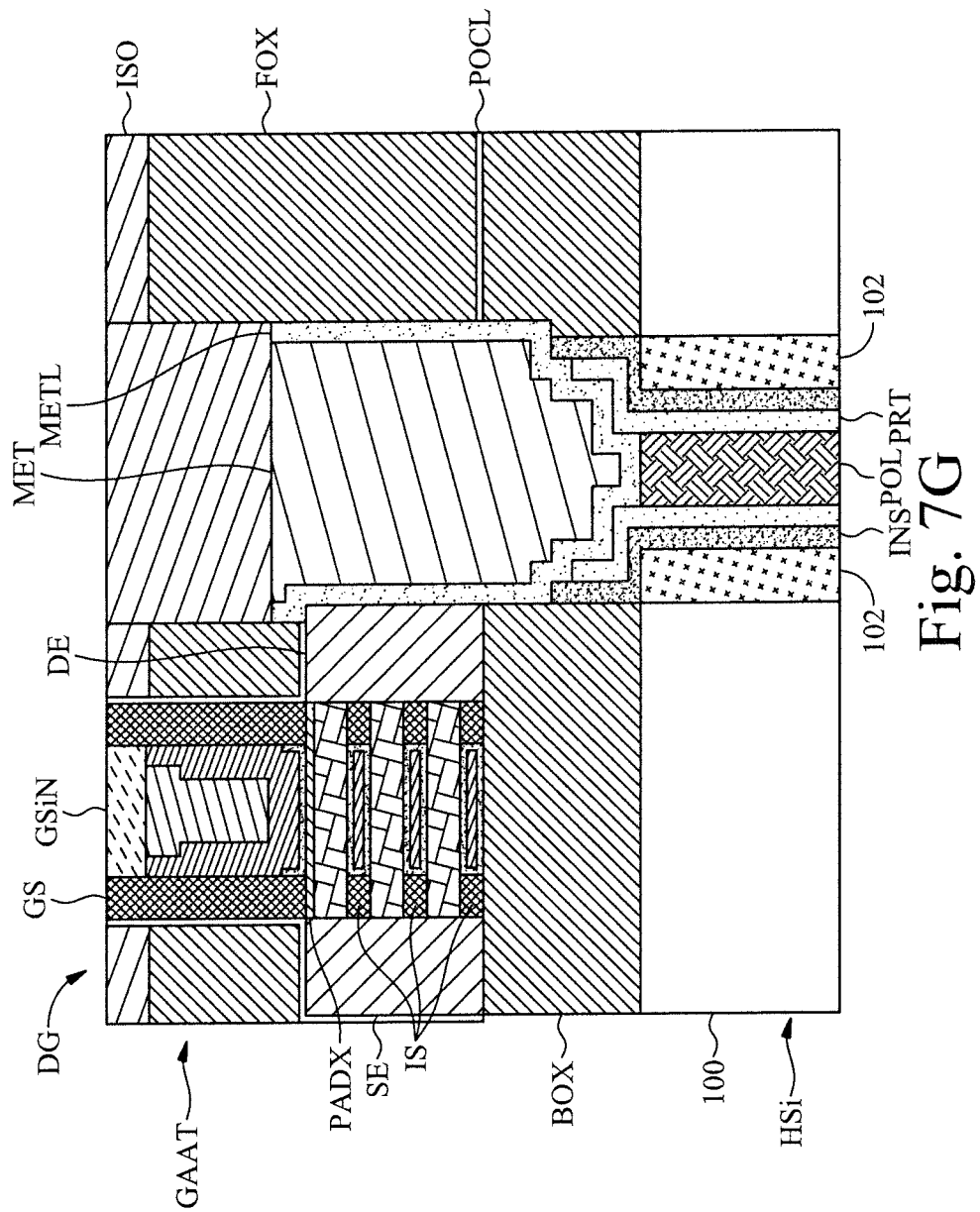

Please refer to FIG. 7G. In any one of the embodiments of the present disclosure, the method S10 includes the steps of: filling the isolation layer ISO; and performing the CMP process to stop on the another gate SiN GSiN.

Figure 7H:
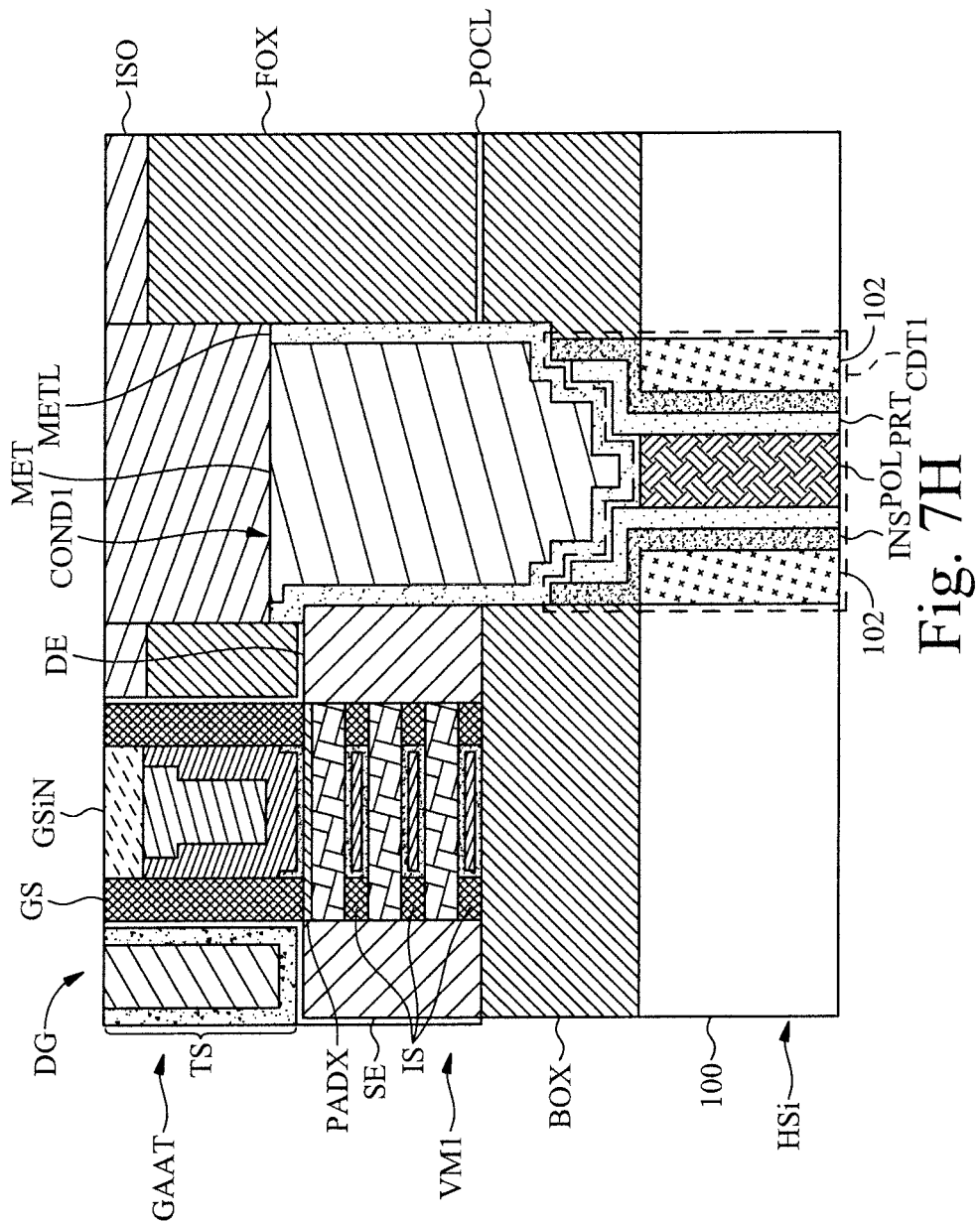

Please refer to FIG. 7H. In any one of the embodiments of the present disclosure, the method S10 includes the step of: forming a tungsten silicide structure TS between the gate spacer GS and one of the gate DG and the source SE.

In any one of the embodiments of the present disclosure, the method S10 further includes steps of: forming a capacitor (CDT, CDT', CDT1) having a first conductive part POL located within the substrate and a second conductive part HPOL located within the deep trench DT; forming a gate-all-around transistor GAAT; and forming a conductor (COND, COND' COND1) connecting the gate-all-around transistor GAAT to the second conductive part HPOL.

In any one of the embodiments of the present disclosure, the method S10 further includes steps of: depositing an insulation layer INS on the epitaxial liner (102, 202) and a deep trench poly silicon POL on the insulation layer to form a capacitor (CDT, CDT', CDT1); forming a dummy gate electrode DG, a source electrode SE and a drain electrode DE; and forming a conductor (COND, COND', CDON1) after forming the dummy gate electrode DG, the source electrode SE and the drain electrode DE, wherein the conductor (COND, COND', CDON1) is a heavily doped poly silicon HPOL or a metal MET connected between the deep trench poly silicon POL and at least one of the source electrode SE and the drain electrode DE.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor device for a volatile memory, comprising:
    a substrate having a first height and made of a first material having a first lattice parameter;
    a side wall defining a deep trench and having a first stress; and
    an epitaxial liner made of a second material having a second lattice parameter, disposed around the side wall, having a second stress to offset the first stress, and having a second height having a level the same as that of the first height, wherein the first and the second lattice parameters are associated with the first stress of the side walls.

2. The semiconductor device as claimed in claim 1, wherein:
    the first material is a silicon material or a non-silicon material being one of a Germanium and a III-V compound;
    the second material includes a IV compound having a first IV element and a second IV element, and the first IV and the second IV elements are in x and y proportions in the IV compound respectively;
    the first IV element is silicon, the second IV element is germanium, and the silicon and the germanium form a $Si_xGe_y$ compound; and
    the epitaxial liner is substantially pseudomorphic to provide a design strain type and a design strain magnitude according to the x and the y proportions, wherein the x proportion ranges from 0.1 to 0.6.

3. The semiconductor device as claimed in claim 1, wherein:
    the deep trench has an aspect ratio tuned by the epitaxial liner;
    the side wall is formed by a crystalline material;
    under a condition that the second lattice parameter is larger than the first lattice parameter, a compressive strain is created by disposing the epitaxial liner around the side wall; and
    under a condition that the second lattice parameter is smaller than the first lattice parameter, a tensile strain is created by disposing the epitaxial liner around the side wall.

4. The semiconductor device as claimed in claim 1, wherein:
    the first material is a host material;
    the host material is a bulk crystalline material having at least one epitaxial layer grown over its surface;
    the substrate is a handle Si layer, and the semiconductor device further comprises:
    a buried oxide layer above the handle Si layer; and
    a device Si layer above the buried oxide layer and having a third material.

5. The semiconductor device as claimed in claim 1, wherein
    the volatile memory includes a capacitor formed among the substrate, the side wall, the epitaxial liner and a poly silicon;
    the volatile memory further includes a conductor and a gate-all-around transistor;
    the conductor is disposed in the deep trench;
    the conductor includes one of a heavily doped poly silicon or a metal;
    the gate-all-around transistor is electrically connected to the capacitor through the conductor
    the gate-all-around transistor is a fin FET including one of a plurality of Silicon nanosheets or nanowires, a plurality of Silicon-Germanium nanosheets or nanowires, or a plurality of Silicon-Carbon nanosheets or nanowires, and is adjacent to the conductor for being electrically connected to the capacitor, wherein the plurality of Silicon-Germanium nanosheets or nanowires has a Germanium proportion<30%, and the plurality of Silicon-Carbon nanosheets or nanowires has a Carbon proportion<2%.

6. The semiconductor device as claimed in claim 1, wherein:
    the epitaxial liner is a single crystal Silicon-Germanium pseudomorphic compressive or tensile liner, to obtain substantially neutral stress in the deep trench;
    the volatile memory includes a capacitor, and further includes a conductor and a gate-all-around transistor;
    the gate-all-around transistor is connected to the capacitor through the conductor; and
    the conductor includes a metal plug which is made of at least one of tungsten (W), TiN, Al, refractory and non-refractory metal materials and their compounds.

7. The semiconductor device as claimed in claim 1, wherein:
    the volatile memory includes a capacitor, and further includes a conductor and a gate-all-around transistor;
    the gate-all-around transistor is connected to the capacitor through the conductor;
    the conductor includes a metal plug introducing a designed compressive, neutral, or tensile stress to adjust fin FET device characteristics of the gate-all-around transistor; and
    A the metal plug has a resistivity in the micro to milliohm-cm range.

8. The semiconductor device as claimed in claim 1, wherein:
    the volatile memory includes a capacitor, and further includes a conductor and a gate-all-around transistor;
    the gate-all-around transistor is connected to the capacitor through the conductor;

the conductor is made of a heavily doped polycrystalline Si with n-type dopants including at least one of P, As and other Vth group elements;

the conductor is made of the heavily doped polycrystalline Si having doping levels>$10^{18}$ with a preferable range of $10^{19}$-$10^{21}$ cm$^{-3}$; and the conductor is a conductive polycrystalline Si plug having a conductive liner to reduce a contact resistance between the conductive polycrystalline Si plug and at least one of source and drain contacts of the gate-all-around transistor.

9. The semiconductor device as claimed in claim 1, wherein the semiconductor device further comprises:
a handle Si layer made of the first material;
a buried oxide layer formed on the handle Si layer;
a device Si layer formed on the buried oxide layer and having a third material; and
a gate-all-around transistor, wherein the gate-all-around transistor is formed based on the device Si layer, and the first material has a crystallographic orientation substantially similar to or different from that of the third material.

10. A method of manufacturing a semiconductor device for a volatile memory, comprising steps of:
providing a substrate having a first height and made of a first material having a first lattice parameter;
etching into the substrate to form a deep trench having a side wall having a first stress;
depositing an epitaxial liner around the side wall, wherein:
the epitaxial liner has a second height having a same level with the first height;
the epitaxial liner is made of a second material having a second lattice parameter, and has a second stress to offset the first stress; and
the first and the second lattice parameters are associated with the first stress of the side walls.

11. The method as claimed in claim 10, wherein the substrate is a handle Si layer, a buried oxide layer is above the handle Si layer, a device Si layer is above the buried oxide layer, and the method further comprises the following steps of:
(A1) depositing sequentially a pad oxide layer, a SiN layer and an oxide hard mask layer on the device Si layer;
(B1) etching the handle Si layer, the buried oxide layer, the device Si layer, the pad oxide, the SiN layer, and the oxide hard mask to a first target thickness to form the deep trench by a Reactive-Ion Etching (RIE) process;
(C1) filling the deep trench with an organic planarization layer (OPL);
(D1) recessing the OPL to a second target thickness;
(E1) forming a dielectric spacer above the OPL and on the side wall;
(F1) stripping the recessed OPL;
(G1) disposing the epitaxial liner below the dielectric spacer;
(H1) stripping the dielectric spacer;
(I1) depositing an insulation structure and a protecting layer on the epitaxial liner and the side wall, wherein the protecting layer includes TiN;
(J1) depositing a poly silicon on the insulation structure and the protecting layer;
(K1) performing a chemical mechanical polishing (CMP) process by starting from the poly silicon and stopping on the SiN layer;
(L1) recessing a part of the polished poly silicon, a part of the polished TiN and a part of the polished insulator structure; and
(M1) filling the deep trench with a high dope poly, performing the CMP process by starting from the SiN layer, and stopping on the device Si layer.

12. The method as claimed in claim 10, wherein the substrate is a handle Si layer, a buried oxide layer is above the handle Si layer, a device Si layer is above the buried oxide layer, and the method further comprises the following steps of:
(A2) depositing sequentially a pad oxide layer, a SiN layer and an oxide hard mask layer on the device Si layer;
(B2) etching the handle Si layer, the buried oxide layer, the device Si layer, the pad oxide layer, the SiN layer, and the oxide hard mask layer to a first target thickness to form a first depth of the deep trench by a Reactive-Ion Etching (RIE) process;
(C2) forming a dielectric spacer above the handle Si layer and on the side wall;
(D2) recessing the handle Si layer to a second target thickness to form a second depth of the deep trench, wherein the second target thickness equals the first height;
(E2) depositing the epitaxial liner around the handle Si layer;
(F2) stripping the dielectric spacer;
(G2) depositing an insulation structure and a protecting layer on the epitaxial liner and the side wall, wherein the protecting layer includes TiN;
(H2) depositing a poly silicon on the insulation structure and the protecting layer
(I2) performing a chemical mechanical polishing (CMP) process by starting from the poly silicon and stopping on the SiN layer;
(J2) recessing a part of the polished poly silicon, a part of the polished TiN and a part of the polished insulator structure; and
(K2) filling the deep trench with a high dope poly, and performing the CMP process by starting from the SiN layer and stopping on the device Si layer.

13. The method as claimed in claim 11, wherein the method further comprises a sub method of forming a gate-all-around transistor and a conductor; and
the sub method follows by the step (M1) or the step (K2), and includes sub steps of:
(N1) forming a gate poly, a gate SiN on the gate poly and a gate spacer respectively to form a dummy gate on the device Si layer by respectively performing a combination process of a depositing process and the RIE process;
(O1) forming uniform nano sheets aligned to the dummy gate by the RIE process;
(P1) forming inner spacers and performing an epitaxy on the uniform nano sheets to form a source electrode and a drain electrode, and thus a gate-all-around transistor is formed;
(Q1) depositing a poly-open CMP (POC) liner which includes a SiN liner formed on the gate SiN, a field oxide and performing the CMP process to stop on the POC liner;
(R1) performing the RIE process to form a first opening for connecting the gate-all-around transistor and the poly silicon;
(S1) filling a heavily doped poly as the conductor, performing the CMP process or the RIE process to stop on the SiN liner;

(T1) recessing a part of the heavily doped poly;
(U1) filling with the field oxide and performing the CMP process to stop on the SiN liner; and
(V1) forming an isolation layer above the field oxide and a tungsten silicide structure between the gate spacer and one of the gate and the source.

14. The method as claimed in claim 11, wherein the method further comprises a sub method of forming a conductor; and
the sub method follows by the step (M1) or the step (K2), and includes sub steps of:
(N1) forming a gate poly, a gate SiN on the gate poly and a gate spacer respectively to form a dummy gate on the device Si layer by respectively performing a combination process of a depositing process and the RIE process;
(O1) forming uniform nano sheets aligned to the dummy gate by the RIE process;
(P1) forming inner spacers and performing an epitaxy on the uniform nano sheets to form a source electrode and a drain electrode, and thus a gate-all-around transistor is formed;
(Q1) depositing a poly-open CMP (POC) liner which includes a SiN liner formed on the gate SiN, a field oxide and performing the CMP process to stop on the POC liner;
(A3) recessing the field oxide, depositing an isolation layer and performing the CMP process to stop on the SiN liner;
(B3) opening the oxide hard mask and the gate SiN, pulling the gate poly and SiGe, depositing a gate insulation layer and a gate tungsten (W) in the dummy gate, and performing the CMP process to stop on the isolation layer;
(C3) recessing the W in the dummy gate, depositing another gate SiN and performing the CMP process to stop on the isolation layer;
(D3) performing the RIE process to form a second opening for connecting the gate-all-around transistor and the poly silicon;
(E3) depositing a WSix and the W and performing the CMP process to stop on the isolation layer, wherein x represents a Si atom number;
(F3) recessing parts of the WSix and the W; and
(G3) filling the isolation layer and performing the CMP process to stop on the another gate SiN; and
(H3) forming a tungsten silicide structure between the gate spacer and one of the gate and the source.

15. The method as claimed in claim 10, further comprising steps of:
forming a capacitor having a first conductive part located within the substrate and a second conductive part located within the deep trench;
forming a gate-all-around transistor; and
forming a conductor connecting the gate-all-around transistor to the second conductive part.

16. The method as claimed in claim 10, the method further comprising steps of:
depositing an insulation layer on the epitaxial liner and a deep trench poly silicon on the insulation layer to form a capacitor;
forming a dummy gate electrode, a source electrode and a drain electrode; and
forming a conductor after forming the dummy gate electrode, the source electrode and the drain electrode, wherein the conductor is a heavily doped poly silicon or a metal connected between the deep trench polysilicon and at least one of the source electrode and the drain electrode.

17. A semiconductor device for a volatile memory, comprising:
a substrate having a first height and made of a first material having a first lattice parameter;
a side wall defining a deep trench; and
an epitaxial liner disposed around the side wall, made of a second material having a second lattice parameter, and having a second height having a same level with the first height, wherein the epitaxial liner and the side wall cooperate for creating a desired aspect ratio for the deep trench.

18. The semiconductor device as claimed in claim 17, further comprising:
an insulation structure formed on the epitaxial liner, wherein the deep trench is filled with a poly silicon to form a deep trench capacitor;
the first material is a silicon or a non-silicon material being one of a Germanium or a III-V compound;
the second material includes a IV compound having a first IV element and a second IV element, and the first IV and the second IV elements are in x and y proportions in the IV compound respectively;
the first IV element is silicon, the second IV element is germanium, and the silicon and the germanium form a SixGey compound; and
the epitaxial liner is substantially pseudo-morphic to provide a design strain type and a design strain magnitude according to the x and the y proportions, wherein the x proportion ranges from 0.1 to 0.6.

19. The semiconductor device as claimed in claim 17, wherein:
the deep trench has an aspect ratio tuned by the epitaxial liner;
the side wall are formed by a crystalline material; and
under a condition that the second lattice parameter is larger than the first lattice parameter, a compressive strain is created by disposing the epitaxial liner around the side wall;
under a condition that the second lattice parameter is less than the first lattice parameter, a tensile strain is created by disposing the epitaxial liner around the side wall.

20. The semiconductor device as claimed in claim 17, wherein:
the first material is a bulk crystalline material having one of a single layer and a plurality of epitaxial layers grown over its surface;
the substrate is a handle Si layer;
a buried oxide layer is above the handle Si layer;
a device Si layer is above the buried oxide layer and has a third material; and
the first material has a crystallographic orientation substantially similar to or different from that of the third material.

21. The method as claimed in claim 12, wherein the method further comprises a sub method of forming a gate-all-around transistor and a conductor; and
the sub method follows by the step (M1) or the step (K2), and includes sub steps of:
(N1) forming a gate poly, a gate SiN on the gate poly and a gate spacer respectively to form a dummy gate on the device Si layer by respectively performing a combination process of a depositing process and the RIE process;

(O1) forming uniform nano sheets aligned to the dummy gate by the RIE process;
(P1) forming inner spacers and performing an epitaxy on the uniform nano sheets to form a source electrode and a drain electrode, and thus a gate-all-around transistor is formed;
(Q1) depositing a poly-open CMP (POC) liner which includes a SiN liner formed on the gate SiN, a field oxide and performing the CMP process to stop on the POC liner;
(R1) performing the RIE process to form a first opening for connecting the gate-all-around transistor and the poly silicon;
(S1) filling a heavily doped poly as the conductor, performing the CMP process or the RIE process to stop on the SiN liner;
(T1) recessing a part of the heavily doped poly;
(U1) filling with the field oxide and performing the CMP process to stop on the SiN liner; and
(V1) forming an isolation layer above the field oxide and a tungsten silicide structure between the gate spacer and one of the gate and the source.

22. The method as claimed in claim 12, wherein the method further comprises a sub method of forming a conductor; and
the sub method follows by the step (M1) or the step (K2), and includes sub steps of:
(N1) forming a gate poly, a gate SiN on the gate poly and a gate spacer respectively to form a dummy gate on the device Si layer by respectively performing a combination process of a depositing process and the RIE process;
(O1) forming uniform nano sheets aligned to the dummy gate by the RIE process;
(P1) forming inner spacers and performing an epitaxy on the uniform nano sheets to form a source electrode and a drain electrode, and thus a gate-all-around transistor is formed;
(Q1) depositing a poly-open CMP (POC) liner which includes a SiN liner formed on the gate SiN, a field oxide and performing the CMP process to stop on the POC liner;
(A3) recessing the field oxide, depositing an isolation layer and performing the CMP process to stop on the SiN liner;
(B3) opening the oxide hard mask and the gate SiN, pulling the gate poly and SiGe, depositing a gate insulation layer and a gate tungsten (W) in the dummy gate, and performing the CMP process to stop on the isolation layer;
(C3) recessing the W in the dummy gate, depositing another gate SiN and performing the CMP process to stop on the isolation layer;
(D3) performing the RIE process to form a second opening for connecting the gate-all-around transistor and the poly silicon;
(E3) depositing a WSix and the W and performing the CMP process to stop on the isolation layer, wherein x represents a Si atom number;
(F3) recessing parts of the WSix and the W; and
(G3) filling the isolation layer and performing the CMP process to stop on the another gate SiN; and
(H3) forming a tungsten silicide structure between the gate spacer and one of the gate and the source.

* * * * *